(12) United States Patent
Hazani

(10) Patent No.: US 10,658,837 B2
(45) Date of Patent: May 19, 2020

(54) SAFETY POWER DISCONNECTION FOR POWER DISTRIBUTION OVER POWER CONDUCTORS TO POWER CONSUMING DEVICES

(71) Applicant: Corning Optical Communications LLC, Charlotte, NC (US)

(72) Inventor: Ami Hazani, Ra'anana (IL)

(73) Assignee: Corning Optical Communications LLC, Charlotte, NC (US)

( * ) Notice: Subject to any disclaimer, the term of this patent is extended or adjusted under 35 U.S.C. 154(b) by 0 days.

(21) Appl. No.: 16/203,520

(22) Filed: Nov. 28, 2018

(65) Prior Publication Data
US 2019/0109490 A1   Apr. 11, 2019

Related U.S. Application Data

(63) Continuation of application No. PCT/IL2018/050368, filed on Mar. 29, 2018.
(Continued)

(51) Int. Cl.
*H02H 7/26* (2006.01)
*H02J 13/00* (2006.01)
(Continued)

(52) U.S. Cl.
CPC .......... *H02H 7/263* (2013.01); *G01R 31/08* (2013.01); *G01R 31/086* (2013.01);
(Continued)

(58) Field of Classification Search
CPC .......... G01R 19/16571; G01R 31/08; G01R 31/086; H02H 1/0007; H02H 7/261;
(Continued)

(56) References Cited

U.S. PATENT DOCUMENTS 5,774,316 A   6/1998 McGary et al.
6,584,197 B1   6/2003 Boudreaux, Jr. et al.
(Continued)

FOREIGN PATENT DOCUMENTS

EP   1347607 A1   9/2003

OTHER PUBLICATIONS

International Search Report and Written Opinion of the International Searching Authority; PCT/IL2018/050368; dated July 24, 2018; 14 Pages; European Patent Office.

*Primary Examiner* — Amritbir K Sandhu
(74) *Attorney, Agent, or Firm* — C. Keith Montgomery

(57) ABSTRACT

Safety power disconnection for remote power distribution in power distribution systems is disclosed. The power distribution system includes one or more power distribution circuits each configured to remotely distribute power from a power source over current carrying power conductors to remote units to provide power for remote unit operations. A remote unit is configured to decouple power from the power conductors thereby disconnecting the load of the remote unit from the power distribution system. A current measurement circuit in the power distribution system measures current flowing on the power conductors and provides a current measurement to the controller circuit. The controller circuit is configured to disconnect the power source from the power conductors for safety reasons in response to detecting a current from the power source in excess of a threshold current level indicating a load.

26 Claims, 13 Drawing Sheets

Related U.S. Application Data

(60) Provisional application No. 62/479,656, filed on Mar. 31, 2017.

(51) Int. Cl.

| | | |
|---|---|---|
| *H02J 1/14* | (2006.01) | |
| *H02H 1/00* | (2006.01) | |
| *H04B 10/077* | (2013.01) | |
| *H04B 10/2575* | (2013.01) | |
| *H04B 10/80* | (2013.01) | |
| *H04Q 11/00* | (2006.01) | |
| *H04W 52/02* | (2009.01) | |
| *G01R 31/08* | (2020.01) | |
| *G01R 19/165* | (2006.01) | |
| *H04W 88/08* | (2009.01) | |

(52) U.S. Cl.
CPC .......... *H02H 1/0007* (2013.01); *H02H 7/261* (2013.01); *H02J 1/14* (2013.01); *H02J 13/0003* (2013.01); *H02J 13/0062* (2013.01); *H02J 13/0065* (2013.01); *H04B 10/0773* (2013.01); *H04B 10/25753* (2013.01); *H04B 10/808* (2013.01); *H04Q 11/0071* (2013.01); *H04W 52/0206* (2013.01); *G01R 19/16571* (2013.01); *H04B 2210/08* (2013.01); *H04Q 2213/08* (2013.01); *H04W 88/085* (2013.01)

(58) Field of Classification Search
CPC .. H02H 7/263; H02J 13/0003; H02J 13/0062; H02J 13/0065; H02J 1/14; H04B 10/0773; H04B 10/25753; H04B 10/808; H04B 2210/08; H04Q 11/0071; H04Q 2213/08; H04W 52/0206; H04W 88/085
USPC ...................................................... 398/16–38
See application file for complete search history.

(56) References Cited

U.S. PATENT DOCUMENTS

| | | | |
|---|---|---|---|
| 7,545,055 B2 | 6/2009 | Barrass | |
| 8,559,150 B2 | 10/2013 | Veroni | |
| 8,605,394 B2* | 12/2013 | Crookham | ........... H05B 37/034 |
| | | | 361/42 |
| 8,781,637 B2 | 7/2014 | Eaves | |
| 9,042,732 B2* | 5/2015 | Cune | ................ H04B 10/25753 |
| | | | 398/96 |
| 9,240,835 B2* | 1/2016 | Berlin | .................. H04B 7/2606 |
| 9,325,429 B2* | 4/2016 | Berlin | ..................... H04L 12/10 |
| 9,497,706 B2* | 11/2016 | Atias | ................. H04W 52/0206 |
| 9,532,329 B2* | 12/2016 | Sauer | ..................... H04W 4/40 |
| 9,673,904 B2* | 6/2017 | Palanisamy | ...... H04B 10/25759 |
| 9,685,782 B2* | 6/2017 | Blackwell, Jr. | .. H04B 10/25753 |
| 10,020,885 B2* | 7/2018 | Mizrahi | ............. H04B 10/2504 |
| 10,257,056 B2* | 4/2019 | Hazani | ............. H04W 52/0206 |
| 10,404,099 B1* | 9/2019 | Bonja | ........................ H02J 1/08 |
| 10,405,356 B2* | 9/2019 | Hazani | ............. H04W 72/042 |
| 2003/0178979 A1 | 9/2003 | Cohen | |
| 2011/0007443 A1 | 1/2011 | Crookham et al. | |
| 2014/0243033 A1* | 8/2014 | Wala | ..................... H04B 7/024 |
| | | | 455/517 |
| 2015/0077130 A1 | 3/2015 | Hackl | |
| 2015/0207318 A1 | 7/2015 | Lowe et al. | |
| 2015/0215001 A1 | 7/2015 | Eaves | |
| 2016/0352393 A1* | 12/2016 | Berlin | ............. H04B 10/25753 |
| 2017/0025842 A1 | 1/2017 | Peterson | |
| 2017/0054496 A1* | 2/2017 | Hazani | ............. H04W 24/06 |
| 2017/0070975 A1* | 3/2017 | Ranson | ............. H04B 7/15507 |
| 2018/0351633 A1* | 12/2018 | Birkmeir | ............... H04L 5/1461 |

\* cited by examiner

SAFETY POWER DISCONNECTION FOR POWER DISTRIBUTION OVER POWER CONDUCTORS TO POWER CONSUMING DEVICES

PRIORITY

This application is a continuation of International Application PCT/IL2018/050368, filed Mar. 29, 2018, which claims priority to U.S. Provisional Patent Application No. 62/479,656 and entitled "Safety Power Disconnection For Power Distribution Over Power Conductors To Power Consuming Devices," filed on Mar. 31, 2017, which are incorporated herein by reference in their entireties.

BACKGROUND

The disclosure relates generally to distribution of power to one or more power consuming devices over power wiring, and more particularly to remote distribution of power to remote units in a power distribution system, which may include distributed communications systems (DCS) such as distributed antenna systems (DAS) for example, for operation of power consuming components of the remote units.

Wireless customers are increasingly demanding wireless communications services, such as cellular communications services and Wi-Fi services. Thus, small cells, and more recently Wi-Fi services, are being deployed indoors. At the same time, some wireless customers use their wireless communication devices in areas that are poorly serviced by conventional cellular networks, such as inside certain buildings or areas where there is little cellular coverage. One response to the intersection of these two concerns has been the use of distributed antenna systems (DASs). DASs include remote antenna units (RAUs) configured to receive and transmit communications signals to client devices within the antenna range of the RAUs. DASs can be particularly useful when deployed inside buildings or other indoor environments where the wireless communication devices may not otherwise be able to effectively receive radio frequency (RF) signals from a source.

In this regard, FIG. 1 illustrates a wireless distributed communications system (WDCS) 100 that is configured to distribute communications services to remote coverage areas 102(1)-102(N), where 'N' is the number of remote coverage areas. The WDCS 100 in FIG. 1 is provided in the form of a DAS 104. The DAS 104 can be configured to support a variety of communications services that can include cellular communications services, wireless communications services, such as RF identification (RFID) tracking, Wireless Fidelity (Wi-Fi), local area network (LAN), and wireless LAN (WLAN), wireless solutions (Bluetooth, Wi-Fi Global Positioning System (GPS) signal-based, and others) for location-based services, and combinations thereof, as examples. The remote coverage areas 102(1)-102(N) are created by and centered on RAUs 106(1)-106(N) connected to a central unit 108 (e.g., a head-end controller, a central unit, or a head-end unit). The central unit 108 may be communicatively coupled to a source transceiver 110, such as for example, a base transceiver station (BTS) or a baseband unit (BBU). In this regard, the central unit 108 receives downlink communications signals 112D from the source transceiver 110 to be distributed to the RAUs 106(1)-106(N). The downlink communications signals 112D can include data communications signals and/or communication signaling signals, as examples. The central unit 108 is configured with filtering circuits and/or other signal processing circuits that are configured to support a specific number of communications services in a particular frequency bandwidth (i.e., frequency communications bands). The downlink communications signals 112D are communicated by the central unit 108 over a communications link 114 over their frequency to the RAUs 106(1)-106(N).

With continuing reference to FIG. 1, the RAUs 106(1)-106(N) are configured to receive the downlink communications signals 112D from the central unit 108 over the communications link 114. The downlink communications signals 112D are configured to be distributed to the respective remote coverage areas 102(1)-102(N) of the RAUs 106(1)-106(N). The RAUs 106(1)-106(N) are also configured with filters and other signal processing circuits that are configured to support all or a subset of the specific communications services (i.e., frequency communications bands) supported by the central unit 108. In a non-limiting example, the communications link 114 may be a wired communications link, a wireless communications link, or an optical fiber-based communications link. Each of the RAUs 106(1)-106(N) may include an RF transmitter/receiver 116(1)-116(N) and a respective antenna 118(1)-118(N) operably connected to the RF transmitter/receiver 116(1)-116(N) to wirelessly distribute the communications services to user equipment (UE) 120 within the respective remote coverage areas 102(1)-102(N). The RAUs 106(1)-106(N) are also configured to receive uplink communications signals 112U from the UE 120 in the respective remote coverage areas 102(1)-102(N) to be distributed to the source transceiver 110.

Because the RAUs 106(1)-106(N) include components that require power to operate, such as the RF transmitter/receivers 116(1)-116(N) for example, it is necessary to provide power to the RAUs 106(1)-106(N). In one example, each RAU 106(1)-106(N) may receive power from a local power source. In another example, the RAUs 106(1)-106(N) may be powered remotely from a remote power source(s). For example, the central unit 108 may include a power source 122 that is configured to remotely supply power over the communications links 114 to the RAUs 106(1)-106(N). For example, the communications links 114 may be cable that includes electrical conductors for carrying current (e.g., direct current (DC)) to the RAUs 106(1)-106(N). If the WDCS 100 is an optical fiber-based WDCS in which the communications links 114 include optical fibers, the communications links 114 may by a "hybrid" cable that includes optical fibers for carrying the downlink and uplink communications signals 112D, 112U and separate electrical conductors for carrying current to the RAUs 106(1)-106(N).

Some regulations, such as IEC 60950-21, may limit the amount of direct current (DC) that is remote delivered by the power source 122 over the communications links 114 to less than the amount needed to power the RAUs 106(1)-106(N) during peak power consumption periods for safety reasons, such as in the event a human contacts the wire. One solution to remote power distribution limitations is to employ multiple conductors and split current from the power source 122 over the multiple conductors, such that the current on any one electrical conductor is below the regulated limit. Another solution includes delivering remote power at a higher voltage so that a lower current can be distributed at the same power level. For example, assume that 300 Watts of power is to be supplied to a RAU 106(1)-106(N) by the power source 122 through a communications link 114. If the voltage of the power source 122 is 60 Volts (V), the current will be 5 Amperes (A) (i.e., 300 W/60 V). However, if a 400 Volt power source 122 is used, then the current flowing through the wires will be 0.75 A. However, delivering high voltage through electrical conductors may be further regulated to prevent an undesired current from flowing through a human in the event that a human contacts the electrical conductor. Thus, these safety measures may require other protections, such as the use of protection conduits, which may make installations more difficult and add cost.

No admission is made that any reference cited herein constitutes prior art. Applicant expressly reserves the right to challenge the accuracy and pertinency of any cited documents.

SUMMARY

Embodiments of the disclosure relate to safety power disconnection for power distribution over power conductors to power consuming devices systems. As a non-limiting example, a such power distribution may be provided in a distributed communications systems (DCS). For example, the DCS may be a wireless DCS, such as a distributed antenna system (DAS) that is configured to distribute communications signals, including wireless communications signals, from a central unit to a plurality of remote units over physical communications media, to then be distributed from the remote units wirelessly to client devices in wireless communication range of a remote unit. In exemplary aspects disclosed herein, the DCS includes one or more power distribution systems each configured to remotely distribute power from a power source over current carrying electrical conductors ("power conductors") to remote units to provide power-to-power consuming components of the remote units for operation. For example, a power distribution system may be installed on each floor of a multi-floor building in which the DCS is installed to provide power to the remote units installed on a given floor. Each power distribution system includes a current measurement circuit configured to measure current delivered by the power source over the power conductors to remote units. Each power distribution system also includes a controller circuit configured to communicate over a management communications link to the remote units receiving power from the power distribution circuit. The remote unit is configured to be decoupled from the power conductors from its power consuming components thereby disconnecting the load of the remote unit from the power distribution system. The current measurement circuit then measures current flowing on the power conductors and provides a current measurement to the controller circuit. The controller circuit is configured to disconnect the power source from the power conductors for safety reasons in response to detection of a load based on detecting a current from the power source in excess of a threshold current level. For example, a person contacting the power conductors will present a load to the power source that will cause a current to flow from the power source over the power conductors. If another load is not contacting the power conductors, no current (or only a small amount current due to current leakages for example) should flow from the power source over the power conductors. The controller circuit can be configured to wait a period of time and/or until a manual reset instruction is received, before connecting the power source from the power conductors and remote unit coupling its power consuming components to the power conductors to once again allow current to flow from the power source to the remote units serviced by the power distribution system.

In this regard, in one exemplary aspect, a power distribution system is disclosed. The power distribution system comprises one or more power distribution circuits. The one or more power distribution circuits each comprise a distribution power input configured to receive current distributed by a power source. The one or more power distribution circuits each also comprise a distribution power output configured to distribute the received current over a power conductor coupled to an assigned remote unit among a plurality of remote units. The one or more power distribution circuits each also comprise a distribution switch circuit coupled between the distribution power input and the distribution power output. The distribution switch circuit comprises a distribution switch control input configured to receive a distribution power connection control signal indicating a distribution power connection mode. The distribution switch circuit is configured to be closed to couple the distribution power input to the distribution power output in response to the distribution power connection mode indicating a distribution power connect state. The distribution switch circuit is further configured to be opened to decouple the distribution power input from the distribution power output in response to the distribution power connection mode indicating a distribution power disconnect state. The one or more power distribution circuits each also comprise a current measurement circuit coupled to the distribution power output and comprising a current measurement output. The current measurement circuit is configured to measure a current at the distribution power output and generate a current measurement on the current measurement output based on the measured current at the distribution power output. The power distribution system also comprises a controller circuit. The controller circuit comprises one or more current measurement inputs communicatively coupled to the one or more current measurement outputs of the one or more current measurement circuits of the one or more power distribution circuits. The controller circuit is configured to, for a power distribution circuit among the one or more power distribution circuits, generate the distribution power connection control signal indicating the distribution power connection mode to the distribution switch control input of the power distribution circuit indicating the distribution power connect state, determine if the measured current on a current measurement input among the one or more current measurement inputs of the power distribution circuit exceeds a predefined threshold current level when the distribution switch circuit is closed to couple the distribution power input to the distribution power output; and in response to the measured current of the power distribution circuit exceeding the predefined threshold current level, communicate the distribution power connection control signal indicating the distribution power connection mode to the distribution switch control input of the power distribution circuit indicating the distribution power disconnect state.

An additional aspect of the disclosure relates to a method of disconnecting current from a power source. The method comprises decoupling current from a power conductor to a remote unit. The method further comprises measuring a current received from a power source coupled to the power conductor. The method further comprises determining if the measured current exceeds a predefined threshold current level. The method further comprises, in response to the measured current exceeding the predefined threshold current level, communicating a distribution power connection control signal comprising a distribution power connection mode indicating a distribution power disconnect state to cause the power conductor to be decoupled from the power source.

An additional aspect of the disclosure relates to a distributed communications system (DCS). The DCS comprises a central unit. The central unit is configured to distribute received one or more downlink communications signals over one or more downlink communications links to one or more remote units. The central unit is also configured to distribute received one or more uplink communications signals from the one or more remote units from one or more uplink communications links to one or more source communications outputs. The DCS also comprises a plurality of remote units. Each remote unit among the plurality of remote units comprises a remote power input coupled to a power conductor carrying current from a power distribution circuit. Each remote unit among the plurality of remote units also comprises a remote switch control circuit configured to generate a remote power connection signal indicating a remote power connection mode. Each remote unit among the plurality of remote units also comprises a remote switch circuit comprising a remote switch input configured to receive the remote power connection signal. The remote switch circuit is configured to be closed to couple to the remote power input in response to the remote power connection mode indicating a remote power connect state. The remote switch circuit is further configured to be opened to decouple from the remote power input in response to the remote power connection mode indicating a remote power disconnect state. The remote unit is configured to distribute the received one or more downlink communications signals received from the one or more downlink communications links, to one or more client devices. The remote unit is also configured to distribute the received one or more uplink communications signals from the one or more client devices to the one or more uplink communications links. The DCS also comprises a power distribution system. The power distribution system comprises one or more power distribution circuits. Each power distribution circuit of the one or more power distribution circuits comprises a distribution power input configured to receive current distributed by a power source. Each power distribution circuit of the one or more power distribution circuits also comprises a distribution power output configured to distribute the received current over a power conductor coupled to an assigned remote unit among a plurality of remote units. Each power distribution circuit of the one or more power distribution circuits also comprises a distribution switch circuit coupled between the distribution power input and the distribution power output, the distribution switch circuit comprising a distribution switch control input configured to receive a distribution power connection control signal indicating a distribution power connection mode. The distribution switch circuit is configured to be closed to couple the distribution power input to the distribution power output in response to the distribution power connection mode indicating a distribution power connect state. The distribution switch circuit is further configured to be opened to decouple the distribution power input from the distribution power output in response to the distribution power connection mode indicating a distribution power disconnect state. Each power distribution circuit of the one or more power distribution circuits also comprises a current measurement circuit coupled to the distribution power output and comprising a current measurement output. The current measurement circuit configured to measure a current at the distribution power output and generate a current measurement on the current measurement output based on the measured current at the distribution power output. The power distribution system also comprises a controller circuit. The controller circuit comprises one or more current measurement inputs communicatively coupled to the one or more current measurement outputs of the one or more current measurement circuits of the one or more power distribution circuits. The controller circuit is configured to, for a power distribution circuit among the one or more power distribution circuits: generate the distribution power connection control signal indicating the distribution power connection mode to the distribution switch control input of the power distribution circuit indicating the distribution power connect state; determine if the measured current on a current measurement input among the one or more current measurement inputs of the power distribution circuit exceeds a predefined threshold current level; and in response to the measured current of the power distribution circuit exceeding the predefined threshold current level, communicate the distribution power connection control signal comprising the distribution power connection mode to the distribution switch control input of the power distribution circuit indicating the distribution power disconnect state.

Additional features and advantages will be set forth in the detailed description which follows and, in part, will be readily apparent to those skilled in the art from the description or recognized by practicing the embodiments as described in the written description and claims hereof, as well as the appended drawings.

It is to be understood that both the foregoing general description and the following detailed description are merely exemplary and are intended to provide an overview or framework to understand the nature and character of the claims.

The accompanying drawings are included to provide a further understanding of the disclosure, and are incorporated in and constitute a part of this specification. The drawings illustrate one or more embodiment(s), and together with the description serve to explain principles and operation of the various embodiments.

DETAILED DESCRIPTION

Embodiments of the disclosure relate to safety power disconnection for power distribution over power conductors to power consuming devices systems. As a non-limiting example, a such power distribution may be provided in a distributed communications systems (DCS). For example, the DCS may be a wireless DCS, such as a distributed antenna system (DAS) that is configured to distribute communications signals, including wireless communications signals, from a central unit to a plurality of remote units over physical communications media, to then be distributed from the remote units wirelessly to client devices in wireless communication range of a remote unit. In exemplary aspects disclosed herein, the DCS includes one or more power distribution systems each configured to remotely distribute power from a power source over current carrying electrical conductors ("power conductors") to remote units to provide power-to-power consuming components of the remote units for operation. For example, a power distribution system may be installed on each floor of a multi-floor building in which the DCS is installed to provide power to the remote units installed on a given floor. Each power distribution system includes a current measurement circuit configured to measure current delivered by the power source over the power conductors to remote units. Each power distribution system also includes a controller circuit configured to communicate over a management communications link to the remote units receiving power from the power distribution circuit. The remote unit is configured to be decoupled from the power conductors from its power consuming components thereby disconnecting the load of the remote unit from the power distribution system. The current measurement circuit then measures current flowing on the power conductors and provides a current measurement to the controller circuit. The controller circuit is configured to disconnect the power source from the power conductors for safety reasons in response to detection of a load based on detecting a current from the power source in excess of a threshold current level. For example, a person contacting the power conductors will present a load to the power source that will cause a current to flow from the power source over the power conductors. If another load is not contacting the power conductors, no current (or only a small amount current due to current leakages for example) should flow from the power source over the power conductors. The controller circuit can be configured to wait a period of time and/or until a manual reset instruction is received, before connecting the power source from the power conductors and remote unit coupling its power consuming components to the power conductors to once again allow current to flow from the power source to the remote units serviced by the power distribution system.

Figure 1:
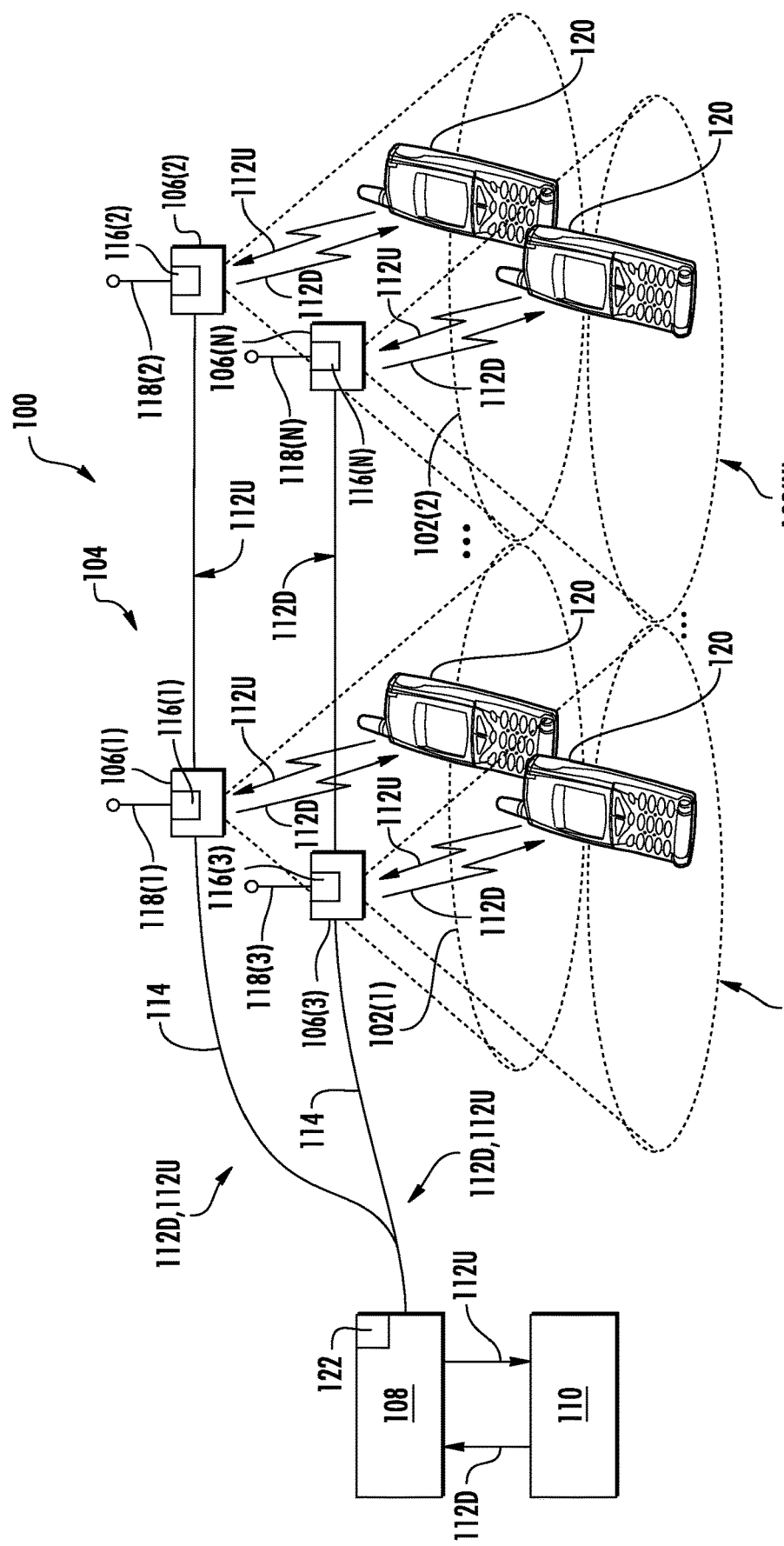
FIG. 1 is a schematic diagram of an exemplary wireless distributed communications system (DCS) in the form of a distributed antenna system (DAS)
Figure 2:
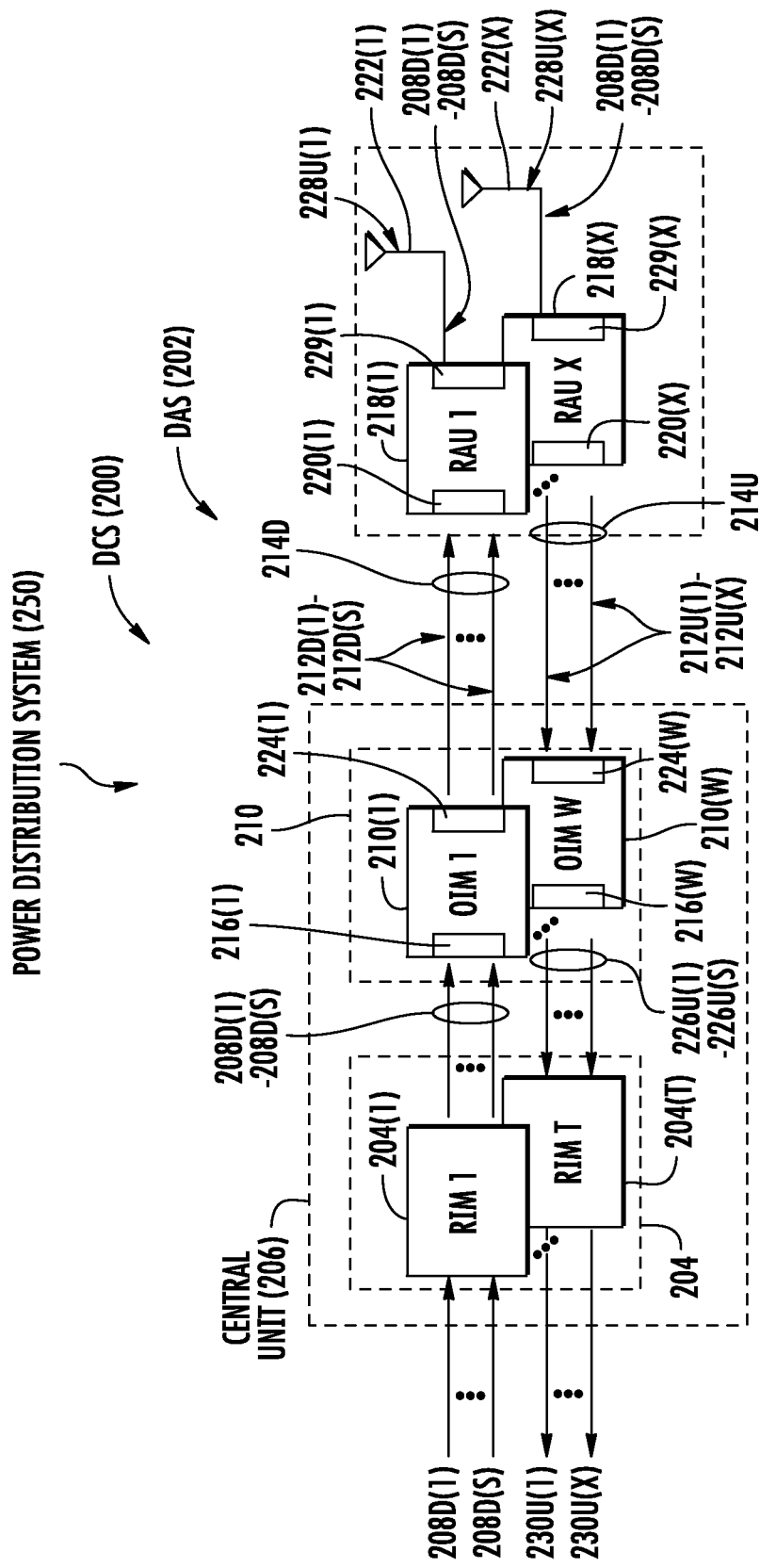
FIG. 2 is a schematic diagram of an exemplary optical-fiber based DCS in the form of a DAS configured to distribute communications signals between a central unit and a plurality of remote units, and that can include one or more power distribution systems configured to distribute power to a plurality of remote units and provide a safety power disconnect of the power source to remote units.
Figure 3A:
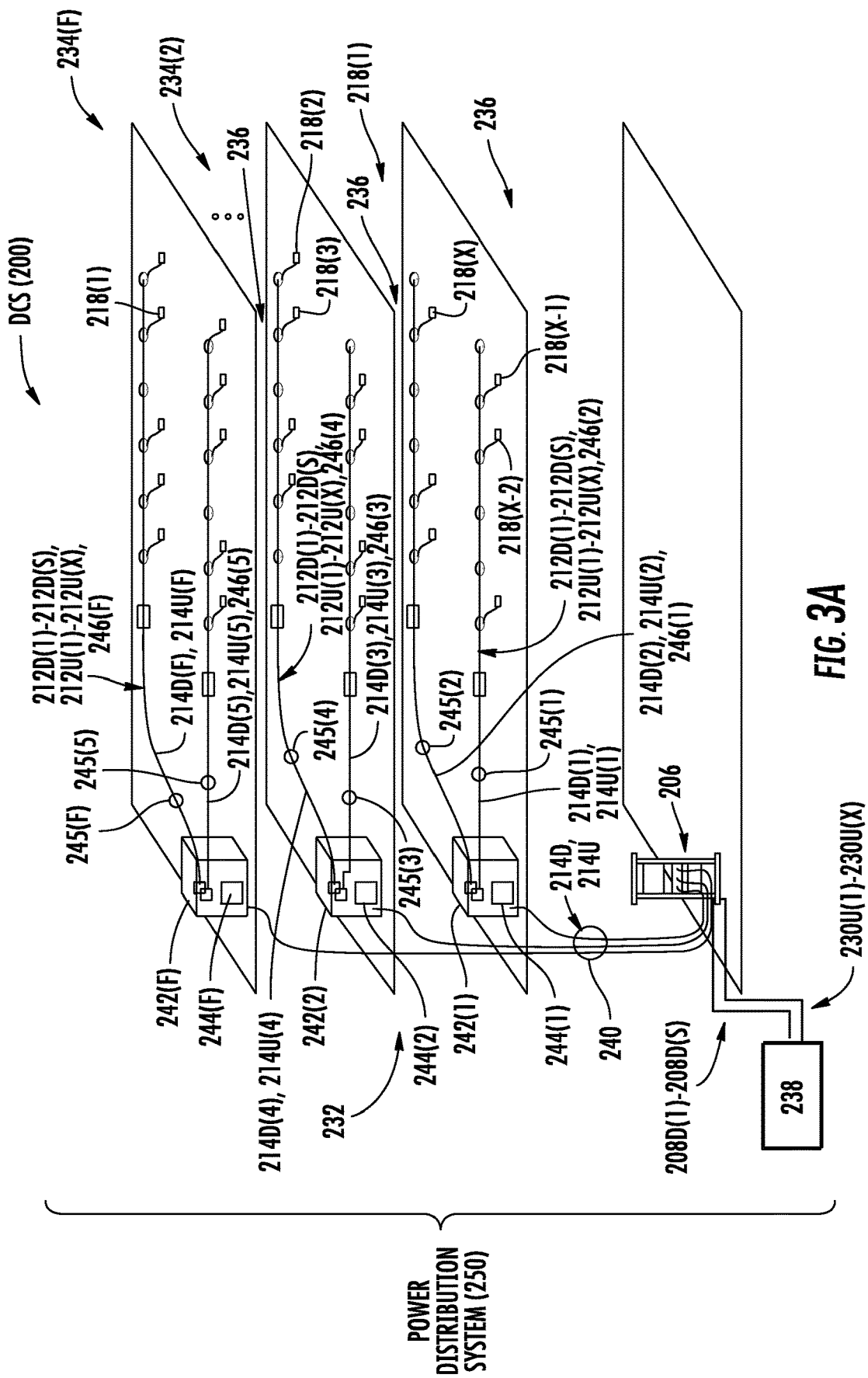
FIG. 3A is a partially schematic cut-away diagram of an exemplary building infrastructure in which a DCS in FIG. 2 can be provided.
Figure 3B:
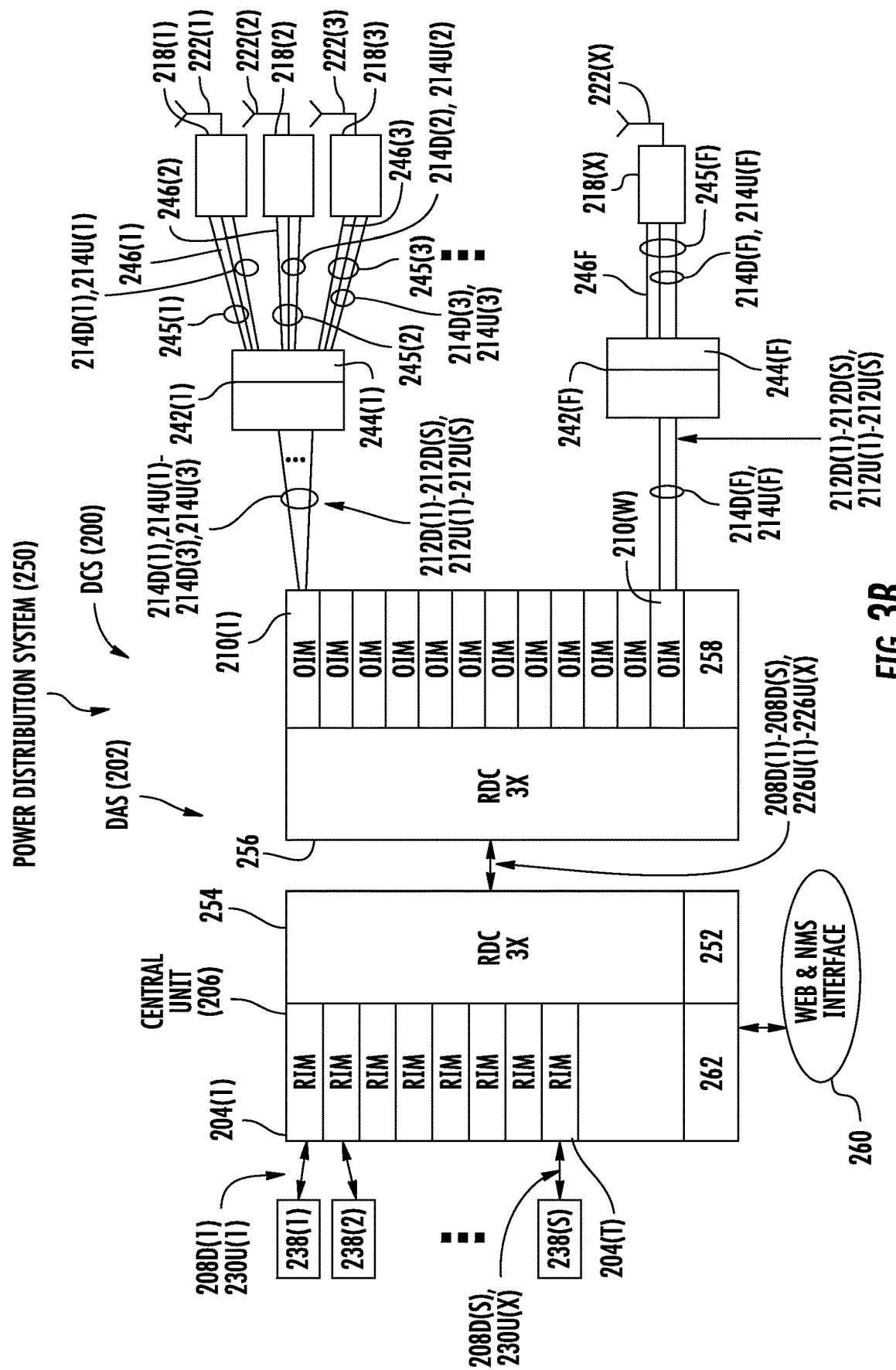
FIG. 3B is a more detailed schematic diagram of the DCS in FIG. 3A.
Figure 4:
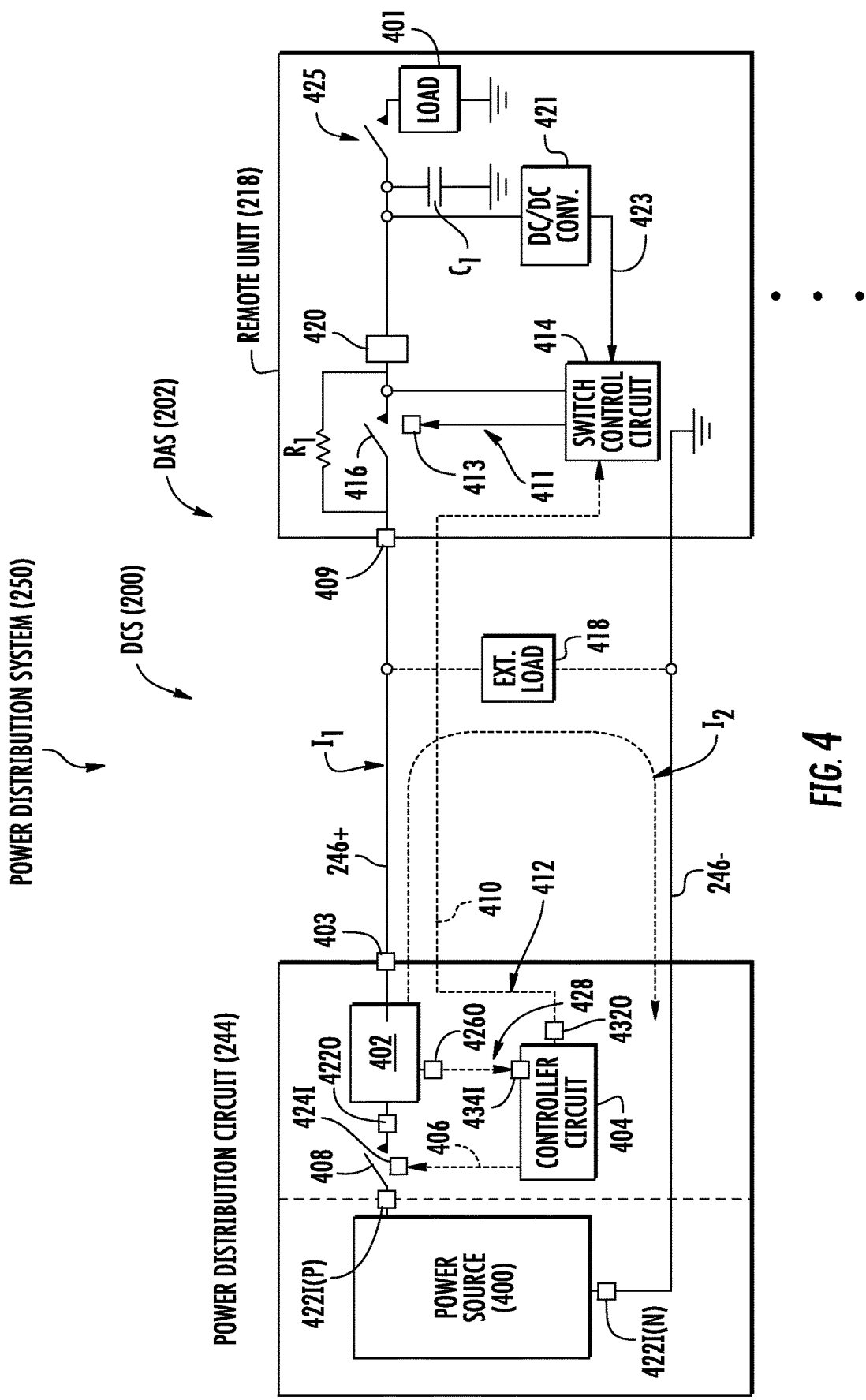
FIG. 4 is a schematic diagram illustrating a power distribution system that can be included in the DCS in FIGS. 2-3B as an example, wherein the power distribution system is configured to provide safety power disconnect of the power source to a remote unit in response to a measured current from the connected power source when the remote unit is decoupled from the power source during a testing phase.

Before discussing exemplary details of power distribution systems, including power distribution systems that can be included in a DCS for remotely distributing power to remote units and provide safety power disconnect of a power source to the remote units starting at FIG. 4, an exemplary power distribution system that can include remote power distribution is described in FIGS. 2-3B.

In this regard, FIG. 2 is a schematic diagram of such an exemplary power distribution system 250. In this example, the power distribution system 250 is provided in the form of a DCS 200, which is a distributed antenna system (DAS) 202 in this example. Note that the power distribution circuit 250 is not limited to a DCS or being provided in a DCS. A DAS is a system that is configured to distribute communications signals, including wireless communications signals, from a central unit to a plurality of remote units over physical communications media, to then be distributed from the remote units wirelessly to client devices in wireless communication range of a remote unit. The DAS 202 in this example is an optical fiber-based DAS that is comprised of three (3) main components. One or more radio interface circuits provided in the form of radio interface modules (RIMs) 204(1)-204(T) are provided in a central unit 206 to receive and process downlink electrical communications signals 208D(1)-208D(S) prior to optical conversion into downlink optical communications signals. The downlink electrical communications signals 208D(1)-208D(S) may be received from a base transceiver station (BTS) or baseband unit (BBU) as examples. The downlink electrical communications signals 208D(1)-208D(S) may be analog signals or digital signals that can be sampled and processed as digital information. The RIMs 204(1)-204(T) provide both downlink and uplink interfaces for signal processing. The notations "1-S" and "1-T" indicate that any number of the referenced component, 1-S and 1-T, respectively, may be provided.

With continuing reference to FIG. 2, the central unit 206 is configured to accept the plurality of RIMs 204(1)-204(T) as modular components that can easily be installed and removed or replaced in a chassis. In one embodiment, the central unit 206 is configured to support up to twelve (12) RIMs 204(1)-204(12). Each RIM 204(1)-204(T) can be designed to support a particular type of radio source or range of radio sources (i.e., frequencies) to provide flexibility in configuring the central unit 206 and the DAS 202 to support the desired radio sources. For example, one RIM 204 may be configured to support the Personal Communication Services (PCS) radio band. Another RIM 204 may be configured to support the 700 MHz radio band. In this example, by inclusion of these RIMs 204, the central unit 206 could be configured to support and distribute communications signals, including those for the communications services and communications bands described above as examples.

The RIMs 204(1)-204(T) may be provided in the central unit 206 that support any frequencies desired, including but not limited to licensed US FCC and Industry Canada frequencies (824-849 MHz on uplink and 869-894 MHz on downlink), US FCC and Industry Canada frequencies (1850-1915 MHz on uplink and 1930-1995 MHz on downlink), US FCC and Industry Canada frequencies (1710-1755 MHz on uplink and 2110-2155 MHz on downlink), US FCC frequencies (698-716 MHz and 776-787 MHz on uplink and 728-746 MHz on downlink), EU R & TTE frequencies (880-915 MHz on uplink and 925-960 MHz on downlink), EU R & TTE frequencies (1710-1785 MHz on uplink and 1805-1880 MHz on downlink), EU R & TTE frequencies (1920-1980 MHz on uplink and 2110-2170 MHz on downlink), US FCC frequencies (806-824 MHz on uplink and 851-869 MHz on downlink), US FCC frequencies (896-901 MHz on uplink and 929-941 MHz on downlink), US FCC frequencies (793-805 MHz on uplink and 763-775 MHz on downlink), and US FCC frequencies (2495-2690 MHz on uplink and downlink).

With continuing reference to FIG. 2, the received downlink electrical communications signals 208D(1)-208D(S) are provided to a plurality of optical interfaces provided in the form of optical interface modules (OIMs) 210(1)-210(W) in this embodiment to convert the downlink electrical communications signals 208D(1)-208D(S) ("downlink electrical communications signals 208D(1)-208D(S)") into downlink optical communications signals 212D(1)-212D(S). The notation "1-W" indicates that any number of the referenced component 1-W may be provided. The OIMs 210 may include one or more optical interface components (OICs) that contain electrical-to-optical (E-O) converters 216(1)-216(W) to convert the received downlink electrical communications signals 208D(1)-208D(S) into the downlink optical communications signals 212D(1)-212D(S). The OIMs 210 support the radio bands that can be provided by the RIMs 204, including the examples previously described above. The downlink optical communications signals 212D(1)-212D(S) are communicated over a downlink optical fiber communications link 214D to a plurality of remote units 218(1)-218(X) provided in the form of remote antenna units in this example. The notation "1-X" indicates that any number of the referenced component 1-X may be provided. One or more of the downlink optical communications signals 212D(1)-212D(S) can be distributed to each remote unit 218(1)-218(X). Thus, the distribution of the downlink optical communications signals 212D(1)-212D(S) from the central unit 206 to the remote units 218(1)-218(X) is in a point-to-multipoint configuration in this example.

With continuing reference to FIG. 2, the remote units 218(1)-218(X) include optical-to-electrical (O-E) converters 220(1)-220(X) configured to convert the one or more received downlink optical communications signals 212D(1)-212D(S) back into the downlink electrical communications signals 208D(1)-208D(S) to be wirelessly radiated through antennas 222(1)-222(X) in the remote units 218(1)-218(X) to user equipment (not shown) in the reception range of the antennas 222(1)-222(X). The OIMs 210 may also include O-E converters 224(1)-224(W) to convert the received uplink optical communications signals 212U(1)-212U(X) from the remote units 218(1)-218(X) into the uplink electrical communications signals 226U(1)-226U(S) as will be described in more detail below.

With continuing reference to FIG. 2, the remote units 218(1)-218(X) are also configured to receive uplink electrical communications signals 228U(1)-228U(X) received by the respective antennas 222(1)-222(X) from client devices in wireless communication range of the remote units 218(1)-218(X). The uplink electrical communications signals 228U(1)-228U(S) may be analog signals or digital signals that can be sampled and processed as digital information. The remote units 218(1)-218(X) include E-O converters 229(1)-229(X) to convert the received uplink electrical communications signals 228U(1)-228U(X) into uplink optical communications signals 212U(1)-212U(X). The remote units 218(1)-218(X) distribute the uplink optical communications signals 212U(1)-212U(X) over an uplink optical fiber communication link 214U to the OIMs 210(1)-210(W) in the central unit 206. The O-E converters 224(1)-224(W) convert the received uplink optical communications signals 212U(1)-212U(X) into uplink electrical communications signals 230U(1)-230U(X), which are processed by the RIMs 204(1)-204(T) and provided as the uplink electrical communications signals 230U(1)-230U(X) to a source transceiver such as a base transceiver station (BTS) or baseband unit (BBU).

Note that the downlink optical fiber communications link 214D and the uplink optical fiber communications link 214U coupled between the central unit 206 and the remote units 218(1)-218(X) may be a common optical fiber communications link, wherein for example, wave division multiplexing (WDM) may be employed to carry the downlink optical communications signals 212D(1)-212D(S) and the uplink optical communications signals 212U(1)-212U(X) on the same optical fiber communications link. Alternatively, the downlink optical fiber communications link 214D and the uplink optical fiber communications link 214U coupled between the central unit 206 and the remote units 218(1)-218(X) may be single, separate optical fiber communications link, wherein for example, wave division multiplexing (WDM) may be employed to carry the downlink optical communications signals 212D(1)-212D(S) on one common downlink optical fiber and the uplink optical communications signals 212U(1)-212U(X) carried on a separate, only uplink optical fiber. Alternatively, the downlink optical fiber communications link 214D and the uplink optical fiber communications link 214U coupled between the central unit 206 and the remote units 218(1)-218(X) may be separate optical fibers dedicated to and providing a separate communications link between the central unit 206 and each remote unit 218(1)-218(X).

The DCS 200 in FIG. 2 can be provided in an indoor environment as illustrated in FIG. 3A. FIG. 3A is a partially schematic cut-away diagram of a building infrastructure 232 employing the DCS 200. FIG. 3B is a schematic diagram of the DCS 200 installed according to the building infrastructure 232 in FIG. 3A.

With reference to FIG. 3A, the building infrastructure 232 in this embodiment includes a first (ground) floor 234(1), a second floor 234(2), and a Fth floor 234(F), where 'F' can represent any number of floors. The floors 234(1)-234(F) are serviced by the central unit 206 to provide antenna coverage areas 236 in the building infrastructure 232. The central unit 206 is communicatively coupled to a signal source 238, such as a BTS or BBU, to receive the downlink electrical communications signals 208D(1)-208D(S). The central unit 206 is communicatively coupled to the remote units 218(1)-218

(X) to receive optical uplink communications signals 212U(1)-212U(X) from the remote units 218(1)-218(X) as previously described in FIG. 2A. The downlink and uplink optical communications signals 212D(1)-212D(S), 212U(1)-212U(X) are distributed between the central unit 206 and the remote units 218(1)-218(X) over a riser cable 240 in this example. The riser cable 240 may be routed through interconnect units (ICUs) 242(1)-242(F) dedicated to each floor 234(1)-234(F) for routing the downlink and uplink optical communications signals 212D(1)-212D(S), 212U(1)-212U(X) to the remote units 218(1)-218(X). The ICUs 242(1)-242(F) may also include respective power distribution circuits 244(1)-244(F) that include power sources as part of the power distribution system 250, wherein the power distribution circuits 244(1)-244(F) are configured to distribute power remotely to the remote units 218(1)-218(X) to provide power for operating the power consuming components in the remote units 218(1)-218(X). For example, array cables 245(1)-245(F) may be provided and coupled between the ICUs 242(1)-242(F) that contain both optical fibers to provide the respective downlink and uplink optical fiber communications media 214D(1)-214D(F), 214U(1)-214U(F) and power conductors 246(1)-246(F) (e.g., electrical wire) to carry current from the respective power distribution circuits 244(1)-244(F) to the remote units 218(1)-218(X).

With reference to the DCS 200 shown in FIG. 3B, the central unit 206 may include a power supply circuit 252 to provide power to the RIMs 204(1)-204(T), the OIMs 210(1)-210(W), and radio distribution circuits (RDCs) 254, 256. The downlink electrical communications signals 208D(1)-208D(S) and the uplink electrical communications signals 226U(1)-226U(S) are routed from between the RIMs 204(1)-204(T) and the OIMs 210(1)-210(W) through RDCs 254, 256. In one embodiment, the RDCs 254, 256 can support sectorization in the DCS 200, meaning that only certain downlink electrical communications signals 208D(1)-208D(S) are routed to certain RIMs 204(1)-204(T). A power supply circuit 258 may also be provided to provide power to the OIMs 210(1)-210(W). An interface 260, which may include web and network management system (NMS) interfaces, may also be provided to allow configuration and communication to the components of the central unit 206. A microcontroller, microprocessor, or other control circuitry, called a head-end controller (HEC) 262 may be included in central unit 206 to provide control operations for the central unit 206 and the DCS 200.

As discussed above in reference to FIG. 3A and with continuing reference to FIG. 3B, the power distribution circuits 244(1)-244(F) may be provided in the DCS 200 to remotely supply power to the remote units 218(1)-218(X) for operation. For example, the power distribution circuits 244(1)-244(F) may be configured to supply direct current (DC) power due to relative short distances and as a safer option than distributing alternating current (AC) power. Further, distributing DC power may avoid the need to provide AC-DC conversion circuitry in the remote units 218(1)-218(X) saving area and cost. Remotely distributing power to the remote units 218(1)-218(X) may be desired if it is difficult or not possible to locally provide power to the remote units 218(1)-218(X) in their installed locations. For example, the remote units 218(1)-218(X) may be installed in ceilings or on walls of a building. Even if local power is available, the local power may not be capable of supplying enough power-to-power the number of remote units 218(1)-218(X) desired. However, regulations may also limit the amount of DC that is remotely delivered by the power distribution circuits 244(1)-244(F) over the power conductors 246(1)-246(F) to less than the amount needed to power the remote units 218(1)-218(X) during peak power consumption periods for safety reasons, such as in the event a human contacts the power conductors 246(1)-246(F). One solution to these remote power distribution limitations is to employ multiple power conductors 246(1)-246(F) and split current from the power distribution circuits 244(1)-244(F) over the multiple power conductors 246(1)-246(F) as shown, such that the current on any one power conductor 246(1)-246(F) is below the regulated limit. Another solution includes delivering remote power at a higher voltage so that a lower current can be distributed at the same power level. For example, assume that 300 Watts of power is to be supplied to a remote unit 218(1)-218(X) by a power distribution circuit 244(1)-244(F) through a respective power conductor 246(1)-246(F). If the voltage of the power distribution circuit 244(1)-244(F) is 60 Volts (V), the current will be 5 Amperes (A) (i.e., 300 W/60 V). However, if a 400 Volt is employed, then the current flowing through the wires will be 0.75 A. However, delivering high voltage through power conductors 246(1)-246(F) may be further regulated to prevent an undesired current from flowing through a human in the event that a human contacts the power conductor 246(1)-246(F). Thus, these safety measures may require other protections, such as the use of protection conduits for the array cables 245(1)-245(F), which may make installations of the DSC 200 more difficult and add cost.

In this regard, FIG. 4 is a schematic diagram illustrating a power distribution circuit 244 of the power distribution system 250 in the form of the DCS 200 in FIGS. 2-3B. The power distribution circuit 244 in FIG. 4 can be any of the power distribution circuits 244(1)-244(F) in FIGS. 3A and 3B. The power distribution circuit 244 includes a power source 400 that is configured to supply power (i.e., current $I_1$) to be distributed over the power conductors 246+, 246− to a load 401 of the remote unit 218 to provide power to the remote unit 218 for operation of its consuming components. For example, the power source 400 may be a DC/DC power supply (e.g., 48V DC/350V DC) or AC/DC power supply (e.g., AC/350 V DC). The power source 400 may be included in the same housing or chassis as the power distribution circuit 244, or separate from the power distribution circuit 244. As will be discussed in more detail below, the power distribution circuit 244 illustrated in FIG. 4 is configured to provide safety power disconnect of the power source 400 from the power conductors 246+, 246− in response to a measured current $I_2$ from the connected power source 400 when the remote unit 218 is decoupled from the power source 400 during a testing phase. The power distribution circuit 244 includes a current measurement circuit 402 configured to measure the current $I_2$ delivered by the power source 400 to a distribution power output 403 coupled to the power conductors 246+, 246− as an indication of a safety condition as to whether an external load, such as a human, is in contact on the power conductors 246+, 246−. If another load is not contacting the power conductors 246+, 246−, this means no current or only a small amount of current, due to current leakages for example, should flow from the power source 400 to the power conductors 246+, 246−. However, if an external load 418, such as a person, is contacting the power conductors 246+, 246−, this load 418 will present a load to the power source 400 that will cause the current $I_2$ to flow from the power source 400 over the power conductors 246+, 246−. This current $I_2$ can be detected as a method of detecting an external load 418, such as a human, in contact with the power conductors 246+, 246− to cause the power distribution circuit 244 to decouple the power source 400 from the power conductors 246+, 246− as a safety measure.

In this regard, with reference to FIG. 4, the power distribution circuit 244 includes a controller circuit 404. The controller circuit 404 is configured to send a distribution power connection control signal 406 indicating a distribution power connection state to close a distribution switch circuit 408 to couple the power source 400 to the current measurement circuit 402. The closing of the distribution switch circuit 408 allows current $I_1$ to be drawn from the power source 400 and be carried by the power conductor 246+ to a remote power input 409 of the remote unit 218. To determine if an external load 418 other than the remote circuit 218, such as a human, is contacting the power conductors 246+, 246−, the controller circuit 404 could be configured to communicate over a management communications link 410 to the remote unit 218. The management communications link 410 may be electrical conductors (e.g. copper wire) or optical fiber medium as examples. The management communications link 410 may be a bidirectional communications link configured to carry a full duplex signal at a carrier frequency, such as 1.5 MHz for example. The controller circuit 404 is configured to send a remote power connection signal 412 indicating a remote power disconnect state to a switch control circuit 414 coupled to the management communications link 410. In response, the switch control circuit 414 is configured to send a remote power connection signal 411 indicating the remote power disconnect state to a remote switch input 413 to open a remote switch circuit 416 in the remote unit 218 to decouple the remote unit 218 from power conductor 246+ thereby disconnecting the load of the remote unit 218 from the power distribution circuit 244. This allows a measurement current on the power conductors 246+, 246− to be associated with an external load 418 and not the load of the remote unit 218. When the remote switch circuit 416 is open, power is provided to the load 401 from the capacitor $C_1$. The current measurement circuit 402 measures the current on the power conductors 246+, 246− while the remote unit 218 is decoupled from the power source 400. If an external load 418 is not contacting the power conductors 246+, 246−, this means no current (or only a small amount of current due to current leakages for example) should flow from the power source 400 to the power conductors 246+, 246−. However, if an external load 418, such as a person, is contacting the power conductors 246+, 246−, this load 418 will present a load to the power source 400 that will cause current $I_2$ to flow from the power source 400 over the power conductors 246+, 246−. Any measured current $I_2$ by the current measurement circuit 402 is communicated to the controller circuit 404. In response to detection of the external load 418 as a function of the measured current $I_2$ exceeding a predefined threshold current level, the controller circuit 402 is configured to communicate the distribution power connection control signal 406 indicating a distribution power disconnect state to the distribution switch circuit 408 to disconnect the power source 400 from the power conductors 246+, 246− for safety reasons. This is because the external load 418 applied to the power conductors 246+, 246− to cause the current $I_2$ to flow from the power source 400 may be a human contacting the power conductors 246+, 246−.

Note that the management communications link 410 can be a separate communications link from the power conductors 246+, 246− or a modulated signal coupled to the power conductors 246+, 246− such that the remote power connection signal 412 is modulated with power over the power conductors 246+, 246−. If the management communications link 410 is provided as a separate communications link, the management communications link 410 may be electrical conducting wire, such as copper wires for example. The management communications link 410 could also carry power to the switch control circuit 414 to power the switch control circuit 414 since the management communications link 410 is coupled to the switch control circuit 414. For example, the predefined current threshold level may be based on the voltage of the power source 400 and an estimated 2,000 Ohms resistance of a human. For example, the International Electric Code (IEC) 60950-21 entitled "Remote Powering Regulatory Requirements" provides that for a 400 VDC maximum line-to-line voltage, the human body resistance from hand to hand is assumed to be 2,000 Ohms resulting in a body current of 200 mA. The remote unit 218 is eventually recoupled to the power source 400 to once again be operational.

After the controller circuit 404 communicates the distribution power connection control signal 406 indicating the distribution power disconnect state to the distribution switch circuit 408 to disconnect the power source 400 from the power conductors 246+, 246−, the controller circuit 404 can be configured to wait a period of time and/or until a manual reset instruction is received before recoupling the power source 400 to the remote unit 218. In this regard, the controller circuit 404 can communicate the distribution power connection control signal 406 indicating a distribution power connect state to the distribution switch circuit 408 to cause the distribution switch circuit 408 to be closed to couple the power source 400 to the power conductors 246+, 246−. The controller circuit 404 can also send the remote power connection signal 412 indicating a remote power connect state to the switch control circuit 414 to generate the remote power connection signal 411 to cause the remote switch circuit 416 in the remote unit 218 to be closed to once again couple the remote unit 218 to the power conductor 246+ thereby connecting the load of the remote unit 218 to the power distribution circuit 244. The capacitor $C_1$ in the remote unit 218 is charged by the power source 400 when the remote unit 218 is coupled to the power conductors 246+, 246−. The energy stored in the capacitor $C_1$ allows the remote unit 218 to continue to be powered during a testing phase when the remote switch circuit 416 is open. The period of time in which the remote switch circuit 416 is open is such that the discharge of the energy stored in the capacitor $C_1$ is sufficient to power the remote unit 218. A resistor $R_1$ is coupled across the remote switch circuit 416 to allow multiple drops/remote units 218 to be connected to the same power input 409. The overall equal parallel resistances can be a higher than the body/touch resistance of approximately 2 kOhms. The resistance $R_1$ can be increased by reducing capacitance $C_1$ to allow a faster charging time. Powering the switch control circuit 414 in the remote unit 218 from the management communications link 410 could avoid the need or desire to include resistor $R_1$ as the switch control circuit 414 would be capable of powering on faster and thus also synchronizing to the power distribution circuit 244(1) faster. With continuing reference to FIG. 4, note that an optional current limiter circuit 420 can be provided in the remote unit 218 and coupled to the remote switch circuit 416. The current limiter circuit 420 is configured to limit and avoid an in-rush current, which may be identified by the power distribution circuit 244 as an overload. This can cause the controller circuit 404 in the power distribution circuit 244 to send a remote power connection signal 411 indicating the remote power disconnect state to a remote switch input 413 to open a remote switch circuit 416 in the remote unit 218 to decouple the remote unit 218 from power conductor 246+, thereby disconnecting the load of the remote unit 218 from the power distribution circuit 244. A DC/DC converter 421 in the remote unit 218 can convert a high voltage from the power source 400 (e.g., 400 V) to the required operation voltage of the load 401 (e.g. 48 V). A power line 423 can be provided on the output side of the DC/DC converter 421 to provide an operational voltage to the switch control circuit 414 for operation. An optional load switch circuit 425 can also be provided between the current limiter circuit 420 and the load 401 to connect and disconnect the load 401 from the power conductors 246+. For example, the load switch circuit 425 may be under control of the switch control circuit 414.

In an alternative embodiment, the load switch circuit 425 can be locally controlled by the switch control circuit 414 by a pulse width modulated (PWM) signal for example instead of being controlled by the remote power connection signal 412. The PWM rate is set by the switch control circuit 414 to 0% initially. To switch control circuit 414 can gradually increase the PWM rate from 0% to 100% to control inrush current. This can also allow the current limiter circuit 420 to be eliminated, if desired, but elimination or presence is not required.

Figure 5:
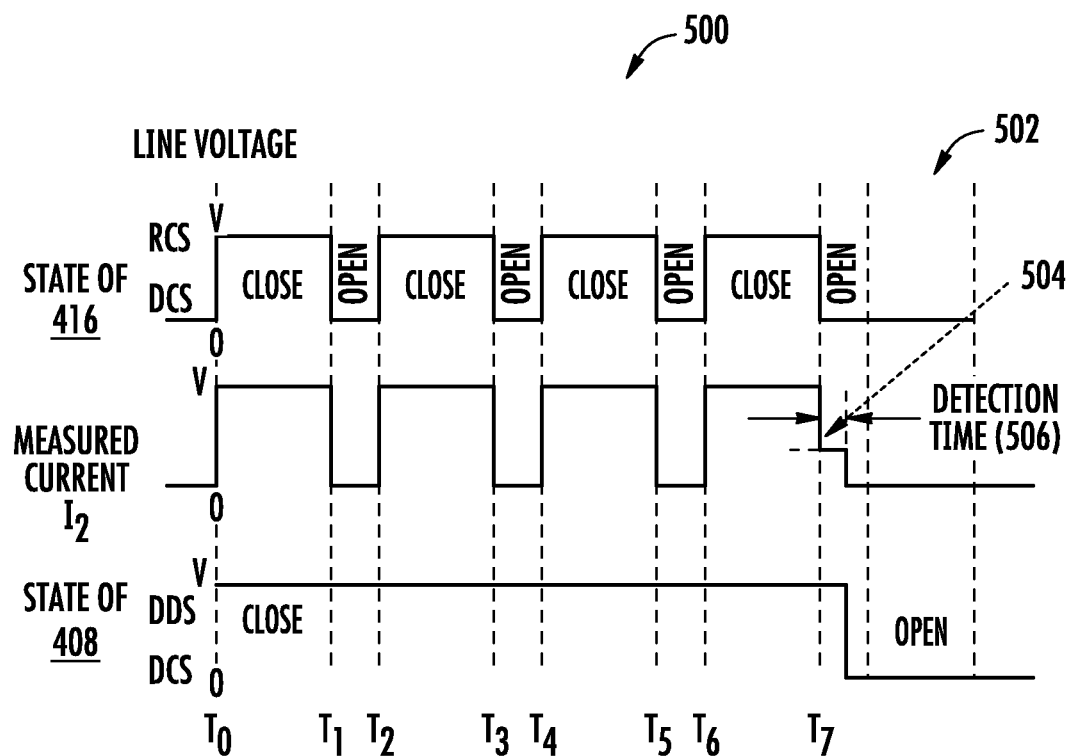
FIG. 5 is a timing diagram illustrating an exemplary timing sequence of the controller circuit in the power distribution system in the DCS in FIG. 4.

In this example in FIG. 4, a fast distribution power connection control signal 406 is employed that is implemented at a lower protocol level for the efficiency of the power transfer, as it allows shorter load disconnect time, as the power transfer is done during the load connecting time. A management signal that is implemented at higher protocol level is subjected to a relatively high delay variations. In on example, the power connection control signal 406 is implemented in the physical level only in order to optimize it to the minimum possible delay variation or jitter. An improved timing synchronization, between the controller circuit 404 and the load disconnect control may allow a shorter load disconnecting time needed for the controller circuit 404 to check for lower current detection. In case of high delay variation, the disconnect time should be larger in order to ensure additional margin in order to allow current measurement to be conducted when there is higher confidence that the load 401 is disconnected. FIG. 5 is a timing diagram 500 illustrating an exemplary timing sequence 502 of the controller circuit 404 in the power distribution circuit 244 in the DCS 200 in FIG. 4 causing the power source 400 to be coupled to the remote unit 218 for normal operation, and causing the power source 400 to be decoupled from the remote unit 218 in a testing operation to detect the external load 418 in contact with the power conductors 246+, 246−. As shown in FIG. 5, the remote power connect state and remote power disconnect state of the remote switch circuit 416 as controlled by the controller circuit 404 is shown as "CLOSE" states starting at time $T_0$, $T_2$, $T_4$, $T_6$, etc. in normal operation phases and "OPEN" states starting at time $T_1$, $T_3$, $T_5$, $T_7$, etc. in testing phases. The period of time between times $T_1$-$T_2$, $T_3$-$T_4$, and $T_5$-$T_6$ when the remote switch circuit 416 is open is controlled such that energy stored in the capacitor $C_1$ when the remote switch circuit 416 is closed is sufficient to power the remote unit 218 during the testing phases. The current measurement circuit 402 measures the current $I_2$ flowing through the power conductors 246+, 246− in FIG. 4. To avoid leakage, in one example, the capacitor $C_1$ can be charged with a low current when the remote switch circuit 416 is open, meaning off. Once capacitor $C_1$ is charged to a high enough voltage such that the switch control circuit 414 can identify the remote power connection signal 412, and the remote switch circuit 416 can be turned on and off periodically as discussed above.

Between times $T_1$-$T_2$, $T_3$-$T_4$, and $T_5$-$T_6$, when the remote switch circuit 416 is open decoupling the remote unit 218 from the power conductors 246+, 246−, the controller circuit 404 detects no current flowing as an indication that the external load 418 is not contacting the power conductors 246+, 246−. However, as shown in FIG. 5, after time $T_7$, the current measurement circuit 402 measures a current $I_2$ which is detected by the controller circuit 404, which is indicative of the external load 418 being in contact with the power conductors 246+, 246−. If the controller circuit 404 detects the current $I_2$ exceeding the predefined threshold current level, this indicates the external load 418 being in contact with the power conductors 246+, 246−. The controller circuit 404 detects the current $I_2$ exceeding the predefined threshold current level shown at 504 in FIG. 5 within the detection time 506. In response, as shown in FIG. 5, the controller circuit 404 will communicate the distribution power connection control signal 406 indicating a distribution power disconnect state to the distribution switch circuit 408 to cause the distribution switch circuit 408 to be opened to decouple the power source 400 from the power conductors 246+, 246− for safety reasons.

Turning back to FIG. 4, the power distribution circuit 244 includes a positive distribution power input 422I(P) configured to receive current distributed by the power source 400. A negative distribution power input 422I(N) provides a return path for the current. The power distribution circuit 244 also includes a distribution power output 422O configured to distribute the received current over the power conductor 246+ coupled to the remote unit 218. The remote unit 218 coupled to the power distribution circuit 244 is deemed assigned to the power distribution circuit 244. The distribution switch circuit 408 is coupled between the positive distribution power input 422I(P) and the distribution power output 422O. The distribution switch circuit 408 includes a distribution switch control input 424I configured to receive the distribution power connection control signal 406 indicating the distribution power connection mode, which is either a distribution power connect state or a distribution power disconnect state. For example, the distribution power connection mode may be indicated by a bit in the distribution power connection control signal 406, where a '1' bit is a distribution power connect state and a '0' bit is a distribution power disconnect state, or vice versa. The distribution switch circuit 408 is configured to be closed to couple the positive distribution power input 422I(P) to the distribution power output 422O in response to the distribution power connection mode of the distribution power connection control signal 406 indicating the distribution power connect state. The distribution switch circuit 408 is further configured to be opened to decouple the positive distribution power input 422I(P) from the distribution power output 422O in response to the distribution power connection mode of the distribution power connection control signal 406 indicating the distribution power disconnect state.

With continuing reference to FIG. 4, the current measurement circuit 402 of the power distribution circuit 244 is coupled to the distribution power output 422O. The current measurement circuit 402 includes a current measurement output 426O. The current measurement circuit 402 is configured to measure a current at (i.e., flowing to) the distribution power output 422O and generate a current measurement 428 on the current measurement output 426O based on the measured current at the distribution power output 422O. The power distribution circuit 244 also includes a distribution management communications output 432O coupled to the management communications link 410, which is coupled to the assigned remote unit 218. The controller circuit 404 includes a current measurement input 434I communicatively coupled to current measurement output 426O of the current measurement circuit 402.

In an alternative embodiment, with reference to FIG. 4, the need to provide the management communications link 410 between the controller circuit 404 in the power distribution circuit 244 and the remote unit 218 to send the remote power connection signal 412 indicating a remote power disconnect state to a switch control circuit 414 in the remote unit 218 can be avoided if desired. For example, the remote unit 218 could be configured to cause the switch control circuit 414 (or the switch control circuit 414 itself could be configured to) periodically open the remote switch circuit 416 to decouple the remote unit 218 from power conductor 246+ thereby disconnecting the load of the remote unit 218 from the power distribution circuit 244. The remote unit 218 and/or the switch control circuit 414 can synchronize to the controller circuit 404 generating the distribution power connection control signal 406 to the distribution switch circuit 408 to disconnect the power source 400 from the power conductors 246+, 246−. For example, the switch control circuit 414 in the remote unit 218 can be configured to monitor changes in current $I_1$ on the power conductor 246+. The current $I_1$ will drop each time the distribution switch circuit 408 disconnects the power source 400 from the power conductors 246+, 246−, thereby disconnecting the load of the remote unit 218 from the power distribution circuit 244. For example, the controller circuit 404 can be configured to disconnect the remote unit 218 every 2 ms. The remote switch circuit 416 can synchronize to this periodic disconnection event in a short period of time. Thus, if the switch control circuit 414 does not see a current drop on power conductors 246+ within a predefined period of time when expected according to the expected periodic disconnect time according to the timing determined by synchronization process, the switch control circuit 414 can open the remote switch circuit 416 to decouple the remote unit 218 from power conductor 246+ thereby disconnecting the load of the remote unit 218 from the power distribution circuit 244. The switch control circuit 414 can close the remote switch circuit 416 to recouple the remote unit 218 to the power conductor 246+ thereby connecting the load of the remote unit 218 from the power distribution circuit 244 based on the expected timing of when the power distribution circuit 244 will close the distribution switch circuit 408 according to the timing determined by synchronization process. The discussion of further operation of the power distribution circuit 244 and the remote unit 218 discussed above for measuring current on the power conductors 246+, 246− is also applicable for this embodiment.

In a second alternative embodiment, to avoid the need to provide a separate management communications link 410 between the controller circuit 404 in the power distribution circuit 244, the controller circuit 404 could be configured to periodically drop the output voltage on the power conductor 246+ to a known voltage level (e.g., from 350 VDC to 300 VDC) before communicating the distribution power connection control signal 406 indicating a distribution power disconnect state to the distribution switch circuit 408 to cause the distribution switch circuit 408 to be opened to decouple the power source 400 from the power conductors 246+, 246−. The remote unit 218 and/or the switch control circuit 414 therein can be configured to monitor the voltage on the power conductor 246+ to identify this voltage drop as a remote power connection signal 412 indicating a remote power disconnect state. In response, the switch control circuit 414 can open the remote switch circuit 416 to decouple the remote unit 218 from the power conductor 246+ thereby disconnecting the load 401 of the remote unit 218 from the power distribution circuit 244. The remote unit 218 and/or the switch control circuit 414 can wait a predefined period of time to close the remote switch circuit 416 to recouple the remote unit 218 to the power conductor 246+ thereby connecting the load 401 of the remote unit 218 from the power distribution circuit 244 based on the expected timing of when the power distribution circuit 244 will close the distribution switch circuit 408 according to the timing determined by synchronization process. The discussion of further operation of the power distribution circuit 244 and the remote unit 218 discussed above for measuring current on the power conductors 246+, 246− is also applicable for this embodiment.

In a third alternative embodiment, the management communications link 410 between the controller circuit 404 in the power distribution circuit 244, the controller circuit 404 could be configured to periodically drop the output voltage on the power conductor 246+ to a known voltage level (e.g., from 350 VDC to 300 VDC) before communicating the distribution power connection control signal 406 indicating a distribution power disconnect state to the distribution switch circuit 408 to cause the distribution switch circuit 408 to be opened to decouple the power source 400 from the power conductors 246+, 246−. The remote unit 218 and/or the switch control circuit 414 therein can be configured to monitor the voltage on the power conductor 246+ to identify this voltage drop as a remote power connection signal 412 indicating a remote power disconnect state. In response, the switch control circuit 414 can open the remote switch circuit 416 to decouple the remote unit 218 from the power conductor 246+ thereby disconnecting the load 401 of the remote unit 218 from the power distribution circuit 244. The remote unit 218 and/or the switch control circuit 414 can wait a predefined period of time to close the remote switch circuit 416 to recouple the remote unit 218 to the power conductor 246+ thereby connecting the load 401 of the remote unit 218 from the power distribution circuit 244 based on the expected timing of when the power distribution circuit 244 will close the distribution switch circuit 408 according to the timing determined by synchronization process. The discussion of further operation of the power distribution circuit 244 and the remote unit 218 discussed above for measuring current on the power conductors 246+, 246− is also applicable for this embodiment.

Figure 6:
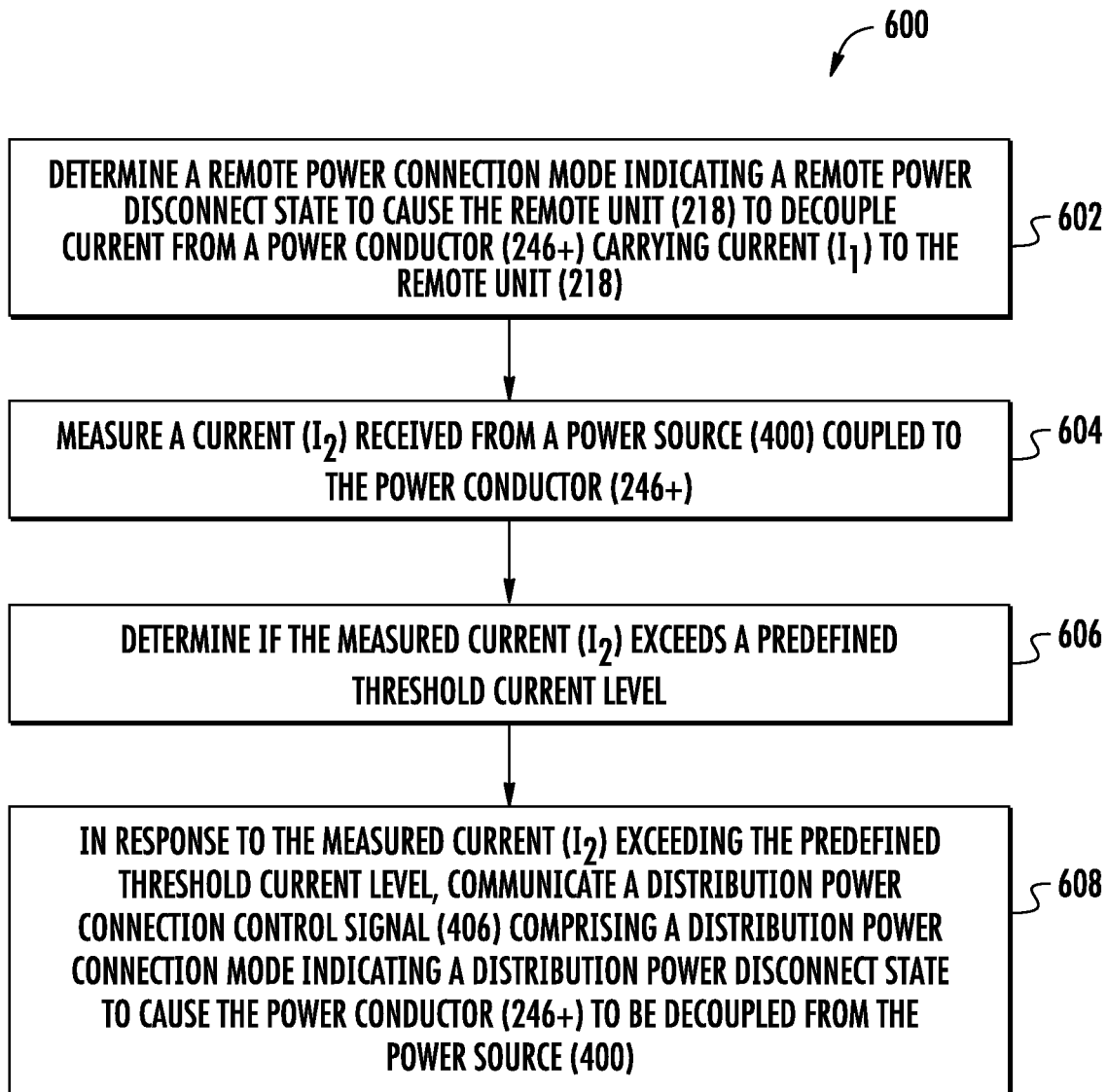
FIG. 6 is a flowchart illustrating an exemplary process of the controller circuit in the power distribution system of the DCS in FIG. 4 coupling the remote unit during a normal operation phase and instructing the remote unit to decouple from the power source during testing phases to then measure current from the power source during a testing phase.

As shown in the exemplary process 600 in FIG. 6 referencing the DCS 200 in FIG. 4, in one example option, the controller circuit 404 is configured to communicate the remote power connection signal 412 comprising a remote power connection mode indicating a remote power disconnect state over the distribution management communications output 432O coupled to the assigned remote unit 218 to cause the remote switch circuit 416 to open and decouple the remote unit 218 from the power conductor 246+ carrying the current $I_1$ (block 602 in FIG. 6). The controller circuit 404 is also configured to measure a current $I_2$ received from the power source 400 coupled to the power conductor 246+ (block 604 in FIG. 6). The controller circuit 404 is configured to determine if the measured current $I_2$ on the current measurement input 434I exceeds a predefined threshold current level (block 606 in FIG. 6). In response to the measured current $I_2$ exceeding the predefined threshold current level indicating that the external load 418 is contacting the power conductor 246+ or 246−, the controller circuit 404 is configured to communicate the distribution power connection control signal 406 comprising the distribution power connection mode indicating the distribution power disconnect state to the distribution switch control input 424I to cause the distribution switch circuit 408 to open to decouple the power source 400 from the current measurement circuit 402 and the power conductor 246+ (block 608 in FIG. 6). For example, the predefined threshold current level may be less than or equal to 200 mA or less than or equal to 100 mA, as examples. If instead, the measured current $I_2$ of the power distribution circuit 244 does not exceed the predefined threshold current level, the controller circuit 404 is configured to communicate the distribution power connection control signal 406 to provide the the distribution power connection mode indicating the distribution power connect state to the distribution switch control input 424I. This causes the distribution switch circuit 408 to close or continue to be closed and couple or continue to couple the power source 400 to the current measurement circuit 402 and the power conductor 246+ for providing power to the remote unit 218.

With continuing reference to FIG. 4, the controller circuit 404 is also configured to communicate the remote power connection signal 412 comprising the remote power connection mode indicating the remote power disconnect state over the distribution management communications output 432O before determining if the measured current $I_2$ on the current measurement input 434I exceeds a predefined threshold current level. This causes the remote switch circuit 416 to open to decouple the remote unit 218 from the power conductors 246+ or 246−. This is so that when it is desired to test to determine if the external load 418 is contacting the power conductors 246+ or 246−, the remote unit 218 is decoupled from the power conductors 246+ or 246− so that the load 401 of the remote unit 218 is not causing a current to be drawn from the power source 400. In this manner, any measured current $I_2$ on the current measurement input 434I is an indication of the external load 418 contacting the power conductors 246+ or 246− and not the load 401 of the remote unit 218. As previously discussed, the energy stored in the capacitor $C_1$ when the remote unit 218 is coupled to the power conductors 246+ or 246− allows the remote unit 218 to continue to be powered during the testing phase when the remote switch circuit 416 is open.

With continuing reference to FIG. 4, after the testing phase, the controller circuit 404 after a predefined period of time is configured to communicate the remote power connection signal 412 with a remote power connection mode indicating a remote power connect state over the distribution management communications output 432O and over the management communications link 410. This causes the remote switch circuit 416 to close so that the remote unit 218 is again coupled to the power conductor 246+ to receive power from the power distribution circuit 244. The controller circuit 404 may be configured to communicate the remote power connection signal 412 with a remote power connection mode indicating a remote power connect state over the distribution management communications output 432O after a predefined period of time has elapsed communicating the remote power connection signal 412 with a remote power connection mode indicating a remote power disconnect state. The controller circuit 404 may be configured to initially communicate the remote power connection signal 412 of the remote power connection mode indicating the remote power connect state before communicating the remote power connection signal 412 of the remote power connection mode indicating the remote power disconnect state, so that the remote unit 218 is initially powered by the power distribution circuit 244 before any testing phases begin. As previously discussed in reference to FIG. 5, the controller circuit 404 may be configured to repeatedly communicate the remote power connection signal 412 of the remote power connection mode indicating the remote power connect state during a normal operation phase, and then communicate the remote power connection signal 412 of the remote power connection mode indicating the remote power disconnect state during a testing phase to continuously detect the external load 418 contacting the power conductors 246+, 246−.

Figure 7:
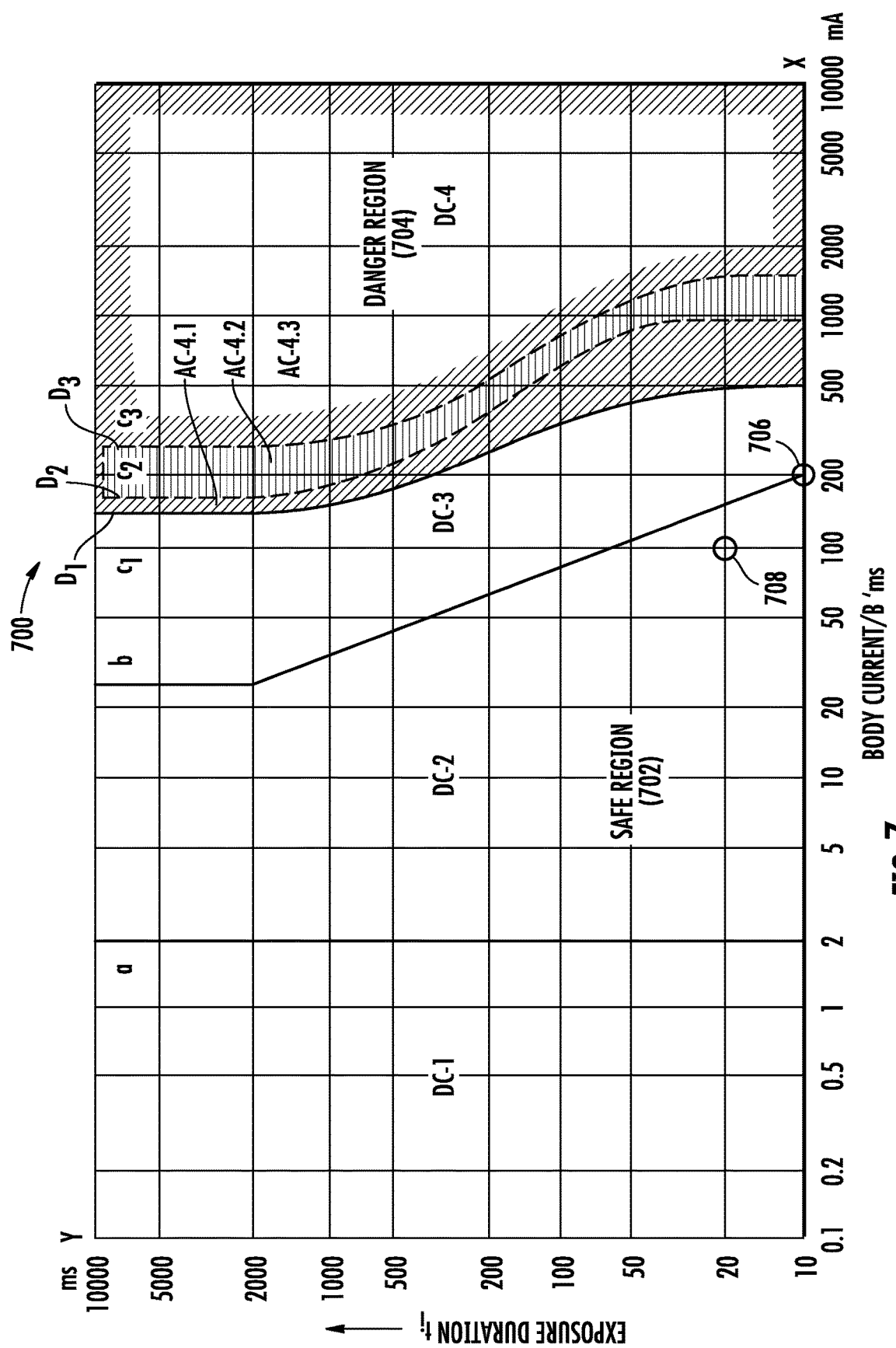
FIG. 7 is a graph illustrating exemplary safe and unsafe regions of body current for a given current impulse time.

FIG. 7 is a graph 700 illustrating exemplary safe and unsafe regions of body current for a given current impulse time. The graph 700 plots a body current in mA on the X-axis, and a time impulse exposure duration in ms on the Y-axis. The curve $D_1$ illustrates a dividing line between a safe region 702 and a danger region 704 for human contact to a current. The shorter the time impulse duration of the current, the safer a human can withstand a larger body current. For example, according to IEC 60947-1, a current of 200 mA that flows through a human body for less than 10 ms is regarded to be safe and thus plotted in the safe region 702. Therefore, in one example, power distribution circuit 244 in FIG. 4 is designed in such a way that the close period of the distribution switch circuit 408 plus the detection time 506 of current measurement circuit 402 (see FIG. 5) will be lower than 10 ms, assuming that the time between current detection and the disconnection of the power supply 400 from the power conductors 246+, 246− by distribution switch circuit 408 is negligible. This is because the current measurement circuit 402 measured the current from the connected power source 400 to detect the external load 418, as opposed to detecting the external load 418 through indirect methods, such as through the discharge of stored energy in capacitor $C_1$ that is charged when a power source is connected and discharges during a testing phase when the power source is disconnected. In the power distribution circuit 244 in FIG. 4, the power source 400 is not decoupled from the power conductors 246+, 246− during the testing phase when the current measuring circuit 402 is measuring current $I_2$. As another example, the power distribution circuit 244 may be configured to detect a body in contact with the power conductors 246+, 246− and cause the distribution switch circuit 408 to be opened in response within approximately 10 ms or less at a 200 mA body current or less as shown in area 706 in graph 700. The power distribution circuit 244 may be also configured to detect a body in contact with the power conductors 246+, 246− within approximately 20 ms or less at a 100 mA body current or less as shown in area 708 in graph 700.

Figure 8:
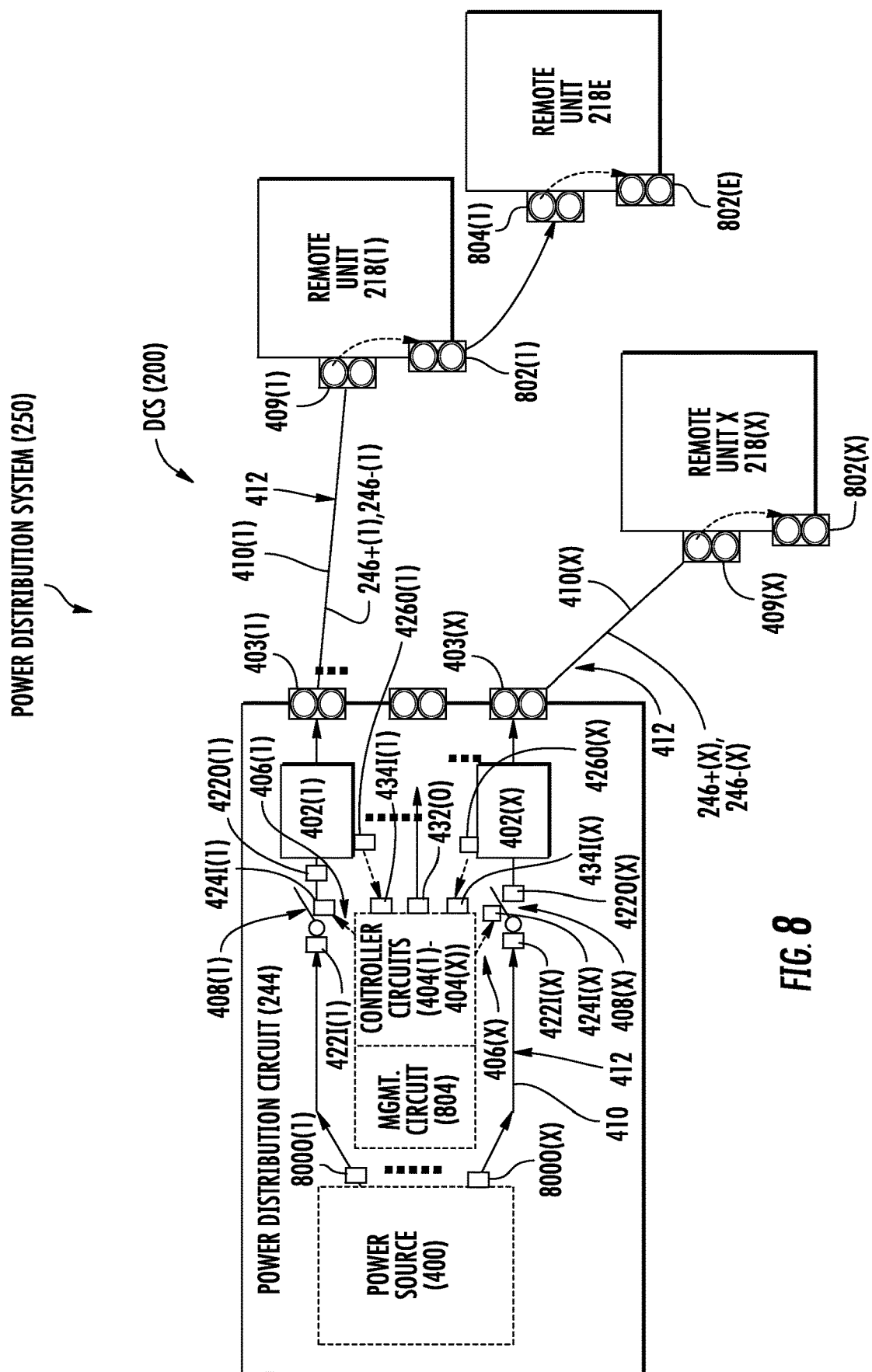
FIG. 8 is a schematic diagram illustrating the DCS in FIG. 4 with the power distribution circuit configured to distribute power from a power source to a plurality of remote units to provide power for operation of the remote units, and provide a safety power disconnect of the power source to remote units in response to a measured current from the power source.

FIG. 8 is a schematic diagram illustrating the power distribution system 250 in the exemplary form of the DCS 200 with the power distribution circuit 244 configured to distribute power to a plurality of remote units 218(1)-218(X). Common components between the DCS 200 and the power distribution system 250 in FIG. 4 and FIG. 8 are shown with common element numbers and will not be re-described. As shown in FIG. 8, a plurality of remote units 218(1)-218(X) are provided. Each remote unit 218(1)-218(X) includes a remote power input 409(1)-409(X) coupled to the power conductors 246+(1), 246−(1), 246+(X), 246−(X), respectively, which are configured to be coupled to the power source 400 as previously described in FIG. 4. The power distribution circuit 244 includes a plurality of power outputs 8000(1)-8000(X) each configured to provide power to a respective distribution switch circuit 408(1)-408(X) and current measurement circuit 402(1)-402(X), which are assigned to different remote units 218(1)-218(X). The current measurement circuits 402(1)-402(X) are each coupled to a respective distribution power output 403(1)-403(X) coupled to respective power conductors 246+(1), 246−(1), 246+(X), 246−(X). Thus, the power distribution from the power distribution circuit 244 to the remote units 218(1)-218(X) is in a point-to-multipoint configuration in this example. The power conductors 246+(1), 246−(1), 246+(X), 246−(X) are also coupled to remote power inputs 409(1)-409(X). The remote units 218(1)-218(X) may also have remote power outputs 802(1)-802(X) that are configured to carry power from the respective power conductors 246+(1), 246−(1), 246+(X), 246−(X) received on the remote power inputs 409(1)-409(X) to an extended remote unit, such as extended remote unit 218E.

Also, as shown in the DCS 200 in FIG. 8, the management communications links 410(1)-410(X) to each of the remote units 218(1)-218(X) are provided by the respective power conductors 246+(1), 246−(1), 246+(X), 246−(X). In this example, a plurality of controller circuits 404(1)-404(X) are provided and dedicated to each distribution power output 403(1)-403(X) to control power distribution for each pair of power conductors 246+(1), 246−(1)-246+(X), 246−(X) through the distribution power outputs 403(1)-403(X) to the remote units 218(1)-218(X). As will be discussed in more detail below, also in this example, a central management circuit 804 is provided that is configured to send multiplexed communications to each of the remote units 218(1)-218(X) to send the remote power connection signal 412 indicating a remote power disconnect state over a respective management communications link 410(1)-410(X) to decouple the respective remote unit 218(1)-218(X) to from the respective power conductor 246+(1)-246+(X) thereby disconnecting the load of the remote unit 218(1)-218(X) from the power distribution circuit 244 similar to previously described with regard to FIG. 4. Any measured current $I_2$ by the respective measurement circuit 402(1)-402(X) is communicated to the respective controller circuit 404(1)-404(X), which is in turn communicated to the central management circuit 804. In response to detection of the external load 418 as a function of the measured current $I_2$ exceeding a predefined threshold current level, the central management circuit 804 is configured to communicate the distribution power connection control signal 406(1)-406(X) indicating a distribution power disconnect state to the respective distribution switch circuit 408(1)-408(X) to disconnect the power source 400 from the respective power conductors 246+(1)-246+(X), 246−(1), 246−(X) for safety reasons. Also, as shown in FIG. 8, an extended remote unit 218E may be coupled to the remote unit 218(1) and also configured to receive power from the power distribution circuit 244 via the remote unit 218(1).

Figure 9:
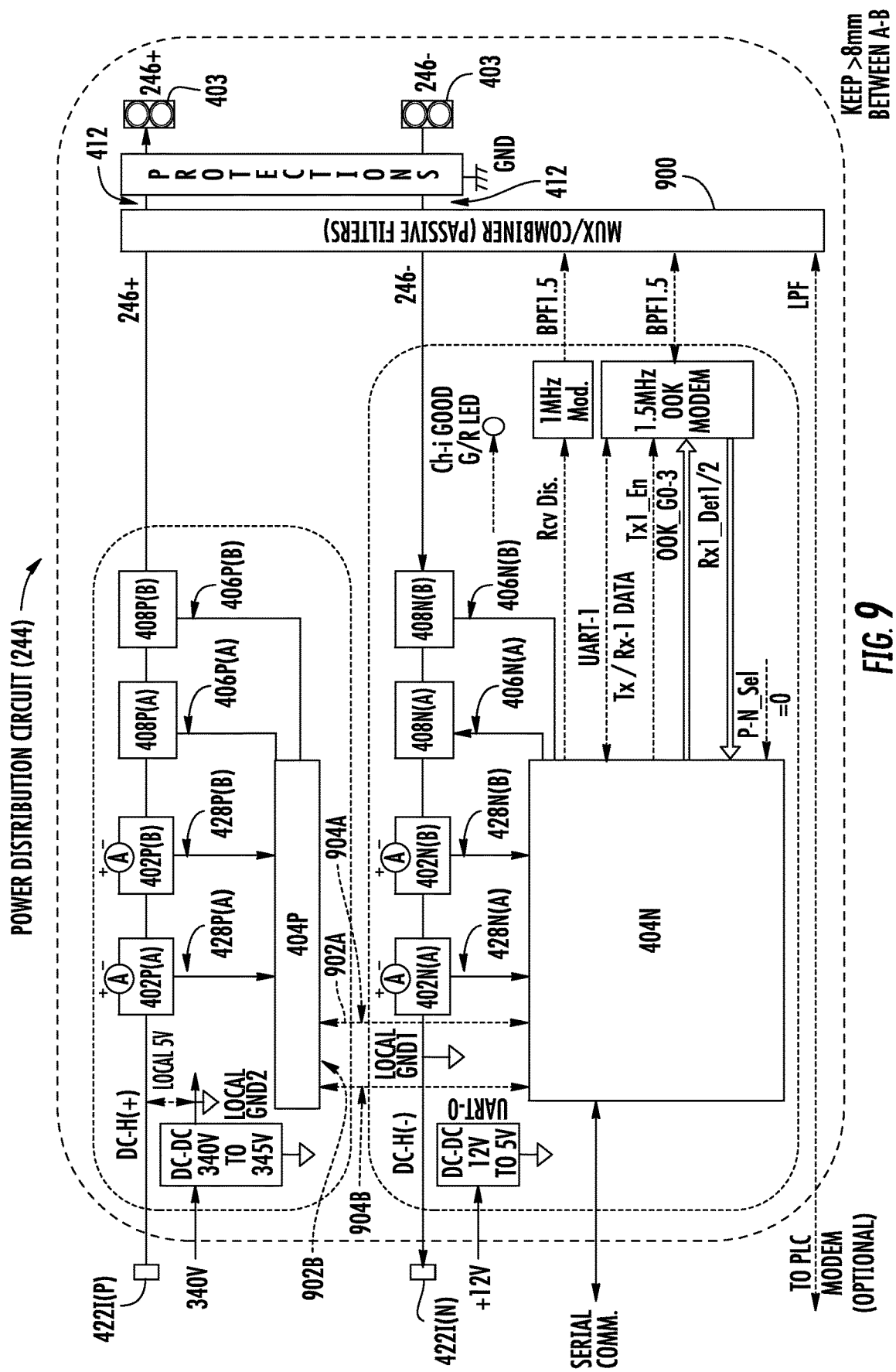
FIG. 9 is a schematic diagram illustrating an exemplary power distribution system that can be employed as the power distribution systems in the DCS in FIG. 8.

FIG. 9 is a schematic diagram illustrating an exemplary power distribution circuit 244 that can be employed as the DCS 200 in FIG. 8. As shown in FIG. 9, a separate positive side controller circuit 404P and a negative side controller circuit 404N are provided. This may provide a lower cost solution than providing a single controller circuit 404 like in FIG. 4 to control power distribution to both the power conductors 246+, 246−. The positive side controller circuit 404P controls the power distribution of power from the power source 400 provided to the positive distribution power input 422I(P) to the power conductor 246_. The negative side controller circuit 404N controls power from the power source 400 provided to the negative distribution power input 422I(N) to the power conductor 246+. The previous discussion regarding the features and options of the controller circuit 404 above are applicable to the positive controller circuit 404P and the negative controller circuit 404N.

With continuing reference to FIG. 9, the negative controller circuit 404N is configured to receive first and second current measurements 428N(A), 428N(B) from first and second current measurement circuits 402N(A), 402N(B). The negative controller circuit 404N is configured to communicate distribution power connection control signals 406N(A), 406N(B) to first and second distribution switch circuits 408N(A), 408N(B) to control the coupling and decoupling of the power source 400 to the power conductor 246− as previously described. The reason for providing the first and second current measurement circuits 402N(A), 402N(B) and the first and second distribution switch circuits 408N(A), 408N(B) is for redundancy in the event that one of the first and second current measurement circuits 402N(A), 402N(B) and/or one of the first and second distribution switch circuits 408N(A), 408N(B) fail.

Similarly, the positive controller circuit 404P is configured to receive first and second current measurements 428P(A), 428P(B) from first and second current measurement circuits 402P(A), 402P(B). The positive controller circuit 404S is also configured to communicate distribution power connection control signals 406P(A), 406P(B) to first and second distribution switch circuits 408P(A), 408P(B) to control the coupling and decoupling of the power source 400 to the power conductor 246+ as previously described. The reason for providing the first and second current measurement circuits 402P(A), 402P(B) and the first and second distribution switch circuits 408P(A), 408P(B) is for redundancy in the event that one of the first and second current measurement circuits 402P(A), 402P(B) and/or one of the first and second distribution switch circuits 408P(A), 408P(B) fail. The power distribution system 250 may service multiple remote units 218(1)-218(X) as illustrated in the DSC 200 in FIG. 8. A multiplexer circuit 900, which may also be a combiner circuit, may also be provided as shown in FIG. 9 to multiplex or combine providing remote power connection signals 412 over the power conductors 246+, 246−, as previously described.

With continuing reference to FIG. 9, isolation control lines 902A, 902B are provided between the positive controller circuit 404P and the negative controller circuit 404N. The isolated control line 902A is used to communicate an immediate alarm signal 904A to both the positive controller circuit 404P and the negative controller circuit 404N when there is a need to transfer an immediate alarm signal 904A to disconnect both the power conductor 246+, 246− due to fault detection, such as an unwanted overload alarm. Another isolation control line 902B is provided between the positive controller circuit 404P and the negative controller circuit 404N. The isolated control line 902B is used as a management link to carry a management signal 904B from the central unit 206 to support management functionalities like setting new current threshold detection levels for example. Examples of current detection thresholds can include leakage or unwanted load detection and maximum load/overcurrent detection. Another example of management functionality is to command the power conductors 246+, 246− to be disconnected to prevent a specific load or user from receiving power.

Figure 10:
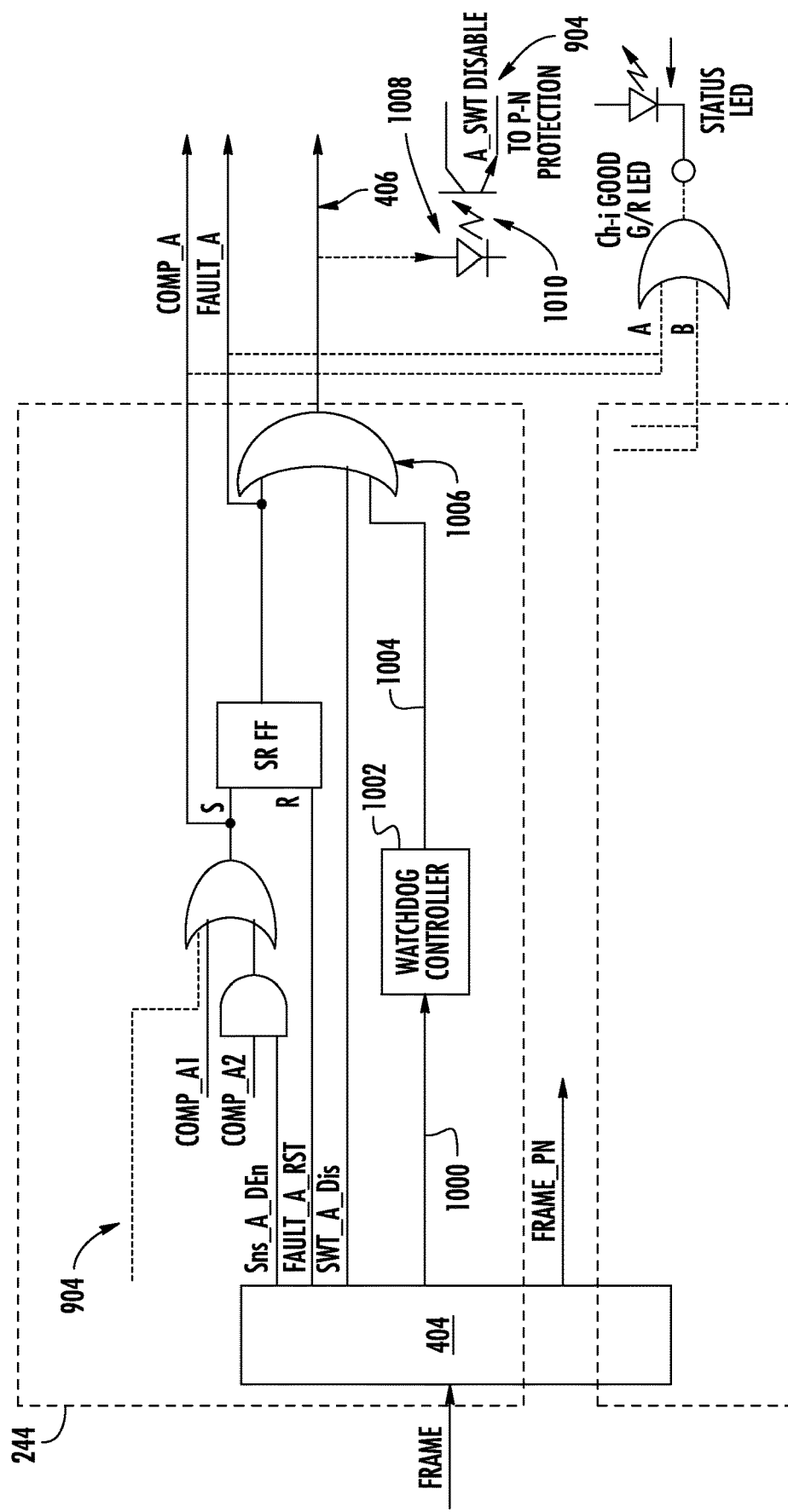
FIG. 10 is a schematic diagram illustrating additional exemplary detail of the controller circuit of the power distribution system in FIG. 8.

FIG. 10 is a schematic diagram illustrating additional exemplary detail of additional safety measures that can be provided for the power distribution circuit 244 of the power distribution system 250 in FIG. 8. In this example, the controller circuit 404 is configured to periodically generate a watchdog signal 1000. For example, the controller circuit 404 may generate a watchdog signal 1000 every 1 ms. A watchdog controller 1002 is provided that is configured to receive the watchdog signal 1000 and provide a watchdog output signal 1004 in response. The watchdog output signal 1004 is provided to a logic circuit 1006 that is configured to control the distribution power connection control signal 406. The logic circuit 1006 is designed so that if the watchdog controller 1002 does not receive the watchdog signal 1000 within a specified period of time, this means that the controller circuit 404 may have failed or otherwise may not be operating property. In response, the watchdog output signal 1004 will be generated to cause the logic circuit 1006 to provide distribution power connection control signal 406 in a distribution power disconnect state to cause the distribution switch circuit 408 to open and decouple the power supply 400 from the power distribution circuit 244.

With continuing reference to FIG. 10, if a fault is detected (e.g., an unwanted overload) such that the power should be decoupled form the power conductors 246+, 246−, the distribution power connection control signal 406 indicating the distribution power connection mode indicating a power disconnection state is also provided to a status LED 1008. An opto-coupler circuit 1010 is provided that is configured to detect the power disconnection state from the status LED 1008 and generate the isolation control signal 904 to the positive controller circuit 404P and the negative controller circuit 404N. This causes disconnection of power to both the power conductor 246+, 246− due to this fault detection.

Figure 11:
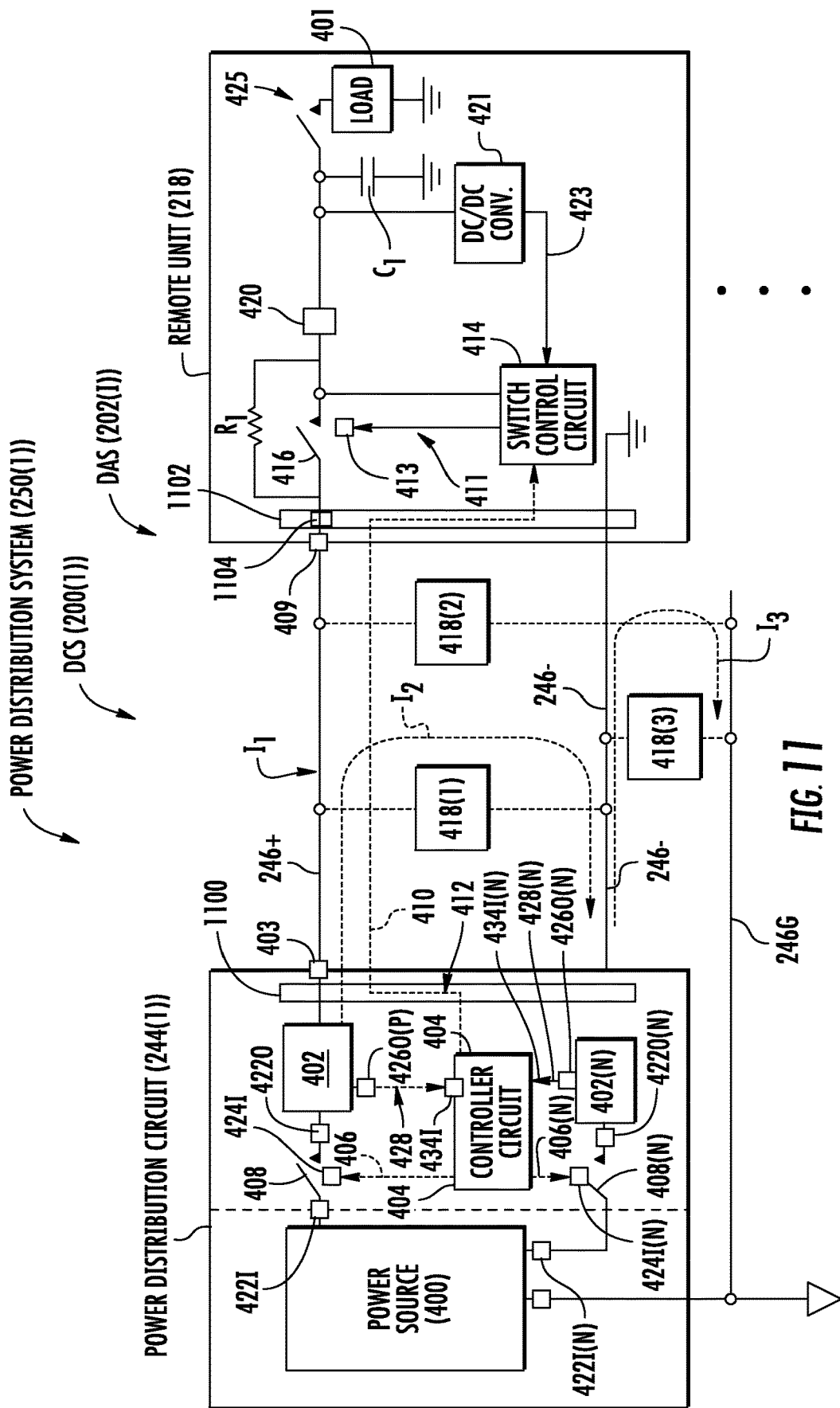
FIG. 11 is a diagram of another exemplary power distribution system that can be provided in the DCS in FIGS. 2 and 3, wherein the power distribution system is configured to provide safety power disconnect of the power source to a remote unit in response to a measured differential current from the connected power source when the remote unit is decoupled from the power source during a testing phase.

FIG. 11 is a schematic diagram illustrating another exemplary, alternative power distribution circuit 244(1) that is provided in power distribution system 250(1) in the exemplary form of a DCS 200(1) similar to the DCS 200 in FIGS. 2-3B. The power distribution circuit 244(1) includes the power source 400 that is configured to supply power (i.e., current $I_1$) to be distributed over the power conductors 246+, 246− to a load 401 of the remote unit 218 to provide power to the remote unit 218 for operation of its consuming components like the power distribution circuit 244 in FIG. 4. Common components between the DCS 200 in FIG. 4 and the DCS 200(1) in FIG. 11 are shown with common element numbers therein, and thus will not be re-described. Components shown in the DCS 200(1) in FIG. 11 shown with a label of '(N)' operate like their counterpart element numbers without label of '(N)' in the DCS 200 in FIG. 4.

In the DCS 200(1) in FIG. 11, the power source 400 is configured to provide a differential voltage, in the form of a positive voltage on power conductor 246+, a negative voltage on power conductor 246−, with a ground conductor 246G. In this example, this allows an external load 418(1) connected between power conductors 246+, 246−, an external load 418(2) connected between power conductors 246+, 246G, an external load 418(3) connected between power conductors 246−, 246G to be detected by the power distribution circuit 244(1). To detect an external load 418(3) connected between power conductors 246−, 246G, another second current measurement circuit 402(N) is provided and coupled to the power conductor 246−. When non-zero current $I_3$ is measured by current measurement circuit 402(N), when remote switch circuit 416 is open, the controller circuit 404 uses this as an indication that an external load 418(3) is connected between power conductors 426− and 426G and directs the distribution switch circuit 408(N) to be opened.

The controller circuit 404 may also be configured to compare the currents $I_2$, $I_3$ measured by current measurement circuits 402, 402(N). If the currents $I_2$, $I_3$ are not substantially identical, the controller circuit 404 may conclude that current flows through an external load contacting between either power conductors 246+, 246− to the ground power conductor ground 426G. In this instance, the controller circuit 404 may cause distribution switch circuits 408 and 408(N) to both be opened to decouple the power source 400 from power conductors 246+, 246−.

Also as shown in FIG. 11, a distribution multiplexer circuit 1100 is provided in the power distribution system 250(1). A remote multiplexer circuit 1102 is provided in the remote unit 218. For example, similar to previously discussed in FIG. 8, the distribution multiplexer circuit 1100 may allow a single controller circuit 404 (or central management circuit therein as provided in FIG. 8), to communicate the distribution power connection control signal 406 to a plurality of remote units 218 one at a time. The distribution multiplexer circuit 1100 multiplexes the remote unit 218, the distribution power connection control signal 406 is sent. The multiplexing may be based on frequency-domain multiplexing (FDM) or time-domain multiplexing (TDM) as non-limiting examples. The remote multiplexer circuit 1102 can demultiplex the distribution power connection control signal 406 for instruction.

It may also be desired for example, to include a diode bridge circuit 1104 (e.g., a full bridge diode circuit) coupled to the power input 409 in the remote unit 218 (e.g., can be part of the remote multiplexer circuit 1102) to in case the power distribution circuit 244(1) identifies fault/or unwanted load, and the controller circuit 404 disconnects distribution switch circuits 408. The diode bridge circuit 1104 can block any potential stored energy from discharging towards the power conductors 246+, 246−. Adding a diode bridge circuit 1104 can also make the power input 409 of the remote unit 218 indifferent (i.e., insensitive) to the polarity of the power conductors 246+, 246− such that the remote unit 218 can function even if there is a polarity reversal in the power conductors 246+, 246−. However a drawback may be that, for high current transfer, there is a relatively high power loss in the diode bridge circuit 1104 (e.g., 5 A on 2 V requires 10 W of heat dissipation).

Note that any of the referenced inputs herein can be provided as input ports or circuits, any of the referenced outputs herein can be provided as output ports or circuits.

Figure 12:
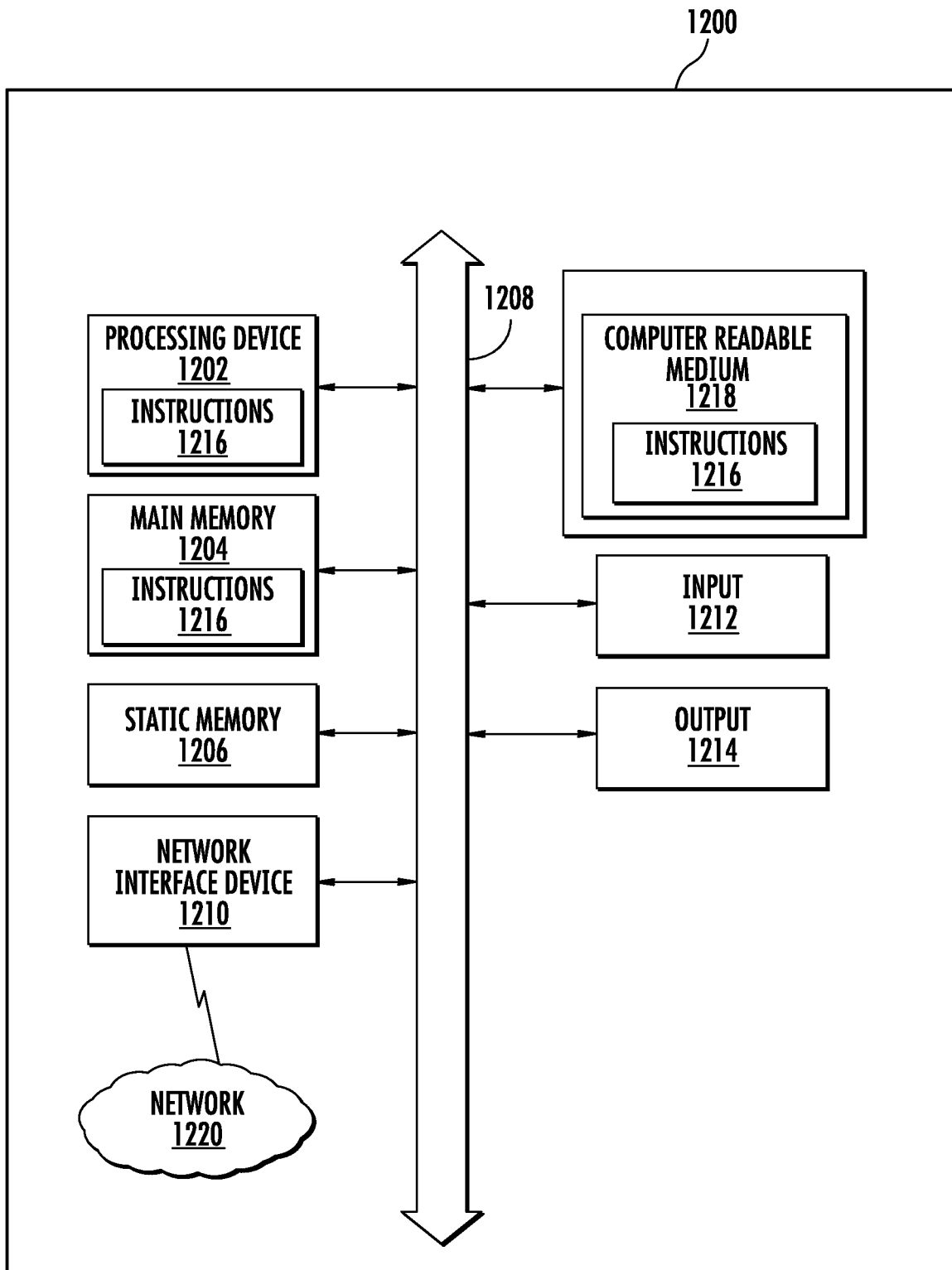
FIG. 12 is a schematic diagram of a generalized representation of an exemplary controller that can be included in any component in a DCS, including but not limited to the controller circuits in the power distribution systems for coupling a remote unit to a power source during a normal operation phase and instructing the remote unit to decouple from the power source during testing phases to then measure current from the power source during a testing phase, wherein an exemplary computer system is adapted to execute instructions from an exemplary computer readable link.

FIG. 12 is a schematic diagram representation of additional detail illustrating a computer system 1200 that could be employed in any component in the DCS 200, including but not limited to the controller circuits 404 in the power distribution systems 250, 250(1) for coupling a remote unit 218 to the power source 400 during a normal operation phase and instructing the remote unit 218 to decouple from the power source 400 during testing phases to then measure current from the power source 400 during a testing phase, including but not limited to the DCS 200 in FIGS. 4, 8 and 11 and the controller circuits 404, 404M, 404S in FIGS. 4 and 8-11. In this regard, the computer system 1200 is adapted to execute instructions from an exemplary computer-readable medium to perform these and/or any of the functions or processing described herein.

In this regard, the computer system 1200 in FIG. 12 may include a set of instructions that may be executed to program and configure programmable digital signal processing circuits in a DCS for supporting scaling of supported communications services. The computer system 1200 may be connected (e.g., networked) to other machines in a LAN, an intranet, an extranet, or the Internet. While only a single device is illustrated, the term "device" shall also be taken to include any collection of devices that individually or jointly execute a set (or multiple sets) of instructions to perform any one or more of the methodologies discussed herein. The computer system 1200 may be a circuit or circuits included in an electronic board card, such as, a printed circuit board (PCB), a server, a personal computer, a desktop computer, a laptop computer, a personal digital assistant (PDA), a computing pad, a mobile device, or any other device, and may represent, for example, a server or a user's computer.

The exemplary computer system 1200 in this embodiment includes a processing device or processor 1202, a main memory 1204 (e.g., read-only memory (ROM), flash memory, dynamic random access memory (DRAM), such as synchronous DRAM (SDRAM), etc.), and a static memory 1206 (e.g., flash memory, static random access memory (SRAM), etc.), which may communicate with each other via a data bus 1208. Alternatively, the processor 1202 may be connected to the main memory 1204 and/or static memory 1206 directly or via some other connectivity means. The processor 1202 may be a controller, and the main memory 1204 or static memory 1206 may be any type of memory.

The processor 1202 represents one or more general-purpose processing devices, such as a microprocessor, central processing unit, or the like. More particularly, the processor 1202 may be a complex instruction set computing (CISC) microprocessor, a reduced instruction set computing (RISC) microprocessor, a very long instruction word (VLIW) microprocessor, a processor implementing other instruction sets, or other processors implementing a combination of instruction sets. The processor 1202 is configured to execute processing logic in instructions for performing the operations and steps discussed herein.

The computer system 1200 may further include a network interface device 1210. The computer system 1200 also may or may not include an input 1212, configured to receive input and selections to be communicated to the computer system 1200 when executing instructions. The computer system 1200 also may or may not include an output 1214, including but not limited to a display, a video display unit (e.g., a liquid crystal display (LCD) or a cathode ray tube (CRT)), an alphanumeric input device (e.g., a keyboard), and/or a cursor control device (e.g., a mouse).

The computer system 1200 may or may not include a data storage device that includes instructions 1216 stored in a computer-readable medium 1218. The instructions 1216 may also reside, completely or at least partially, within the main memory 1204 and/or within the processor 1202 during execution thereof by the computer system 1200, the main memory 1204 and the processor 1202 also constituting computer-readable medium. The instructions 1216 may further be transmitted or received over a network 1220 via the network interface device 1210.

While the computer-readable medium 1218 is shown in an exemplary embodiment to be a single medium, the term "computer-readable medium" should be taken to include a single medium or multiple media (e.g., a centralized or distributed database, and/or associated caches and servers) that store the one or more sets of instructions. The term "computer-readable medium" shall also be taken to include any medium that is capable of storing, encoding, or carrying a set of instructions for execution by the processing device and that cause the processing device to perform any one or more of the methodologies of the embodiments disclosed herein. The term "computer-readable medium" shall accordingly be taken to include, but not be limited to, solid-state memories, optical medium, and magnetic medium.

The embodiments disclosed herein include various steps. The steps of the embodiments disclosed herein may be formed by hardware components or may be embodied in machine-executable instructions, which may be used to cause a general-purpose or special-purpose processor programmed with the instructions to perform the steps. Alternatively, the steps may be performed by a combination of hardware and software.

The embodiments disclosed herein may be provided as a computer program product, or software, that may include a machine-readable medium (or computer-readable medium) having stored thereon instructions, which may be used to program a computer system (or other electronic devices) to perform a process according to the embodiments disclosed herein. A machine-readable medium includes any mechanism for storing or transmitting information in a form readable by a machine (e.g., a computer). For example, a machine-readable medium includes: a machine-readable storage medium (e.g., ROM, random access memory ("RAM"), a magnetic disk storage medium, an optical storage medium, flash memory devices, etc.); and the like.

Unless specifically stated otherwise and as apparent from the previous discussion, it is appreciated that throughout the description, discussions utilizing terms such as "processing," "computing," "determining," "displaying," or the like, refer to the action and processes of a computer system, or similar electronic computing device, that manipulates and transforms data and memories represented as physical (electronic) quantities within the computer system's registers into other data similarly represented as physical quantities within the computer system memories or registers or other such information storage, transmission, or display devices.

The algorithms and displays presented herein are not inherently related to any particular computer or other apparatus. Various systems may be used with programs in accordance with the teachings herein, or it may prove convenient to construct more specialized apparatuses to perform the required method steps. The required structure for a variety of these systems will appear from the description above. In addition, the embodiments described herein are not described with reference to any particular programming language. It will be appreciated that a variety of programming languages may be used to implement the teachings of the embodiments as described herein.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The components of the distributed antenna systems described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends on the particular application, design choices, and/or design constraints imposed on the overall system. Skilled artisans may implement the described functionality in varying ways for each particular application, but such implementation decisions should not be interpreted as causing a departure from the scope of the present embodiments.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA), or other programmable logic device, a discrete gate or transistor logic, discrete hardware components, or any combination thereof designed to perform the functions described herein. Furthermore, a controller may be a processor. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The embodiments disclosed herein may be embodied in hardware and in instructions that are stored in hardware, and may reside, for example, in RAM, flash memory, ROM, Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. Those of skill in the art will also understand that information and signals may be represented using any of a variety of technologies and techniques. For example, data, instructions, commands, information, signals, bits, symbols, and chips, that may be references throughout the above description, may be represented by voltages, currents, electromagnetic waves, magnetic fields, or particles, optical fields or particles, or any combination thereof.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is in no way intended that any particular order be inferred.

It will be apparent to those skilled in the art that various modifications and variations can be made without departing from the spirit or scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A distributed communications system (DCS), comprising:
   a central unit configured to:
      distribute received one or more downlink communications signals over one or more downlink communications links to one or more remote units;
      distribute received one or more uplink communications signals from the one or more remote units from one or more uplink communications links to one or more source communications outputs;
   a plurality of remote units, each remote unit among the plurality of remote units comprising:
      a remote power input coupled to a power conductor carrying current from a power distribution circuit;
      a remote switch control circuit configured to generate a remote power connection signal indicating a remote power connection mode; and
      a remote switch circuit comprising a remote switch input configured to receive the remote power connection signal;
         the remote switch circuit configured to be closed to couple to the remote power input in response to the remote power connection mode indicating a remote power connect state; and
         the remote switch circuit further configured to be opened to decouple from the remote power input in response to the remote power connection mode indicating a remote power disconnect state;
      each remote unit among the plurality of remote units configured to:
         distribute the received one or more downlink communications signals received from the one or more downlink communications links, to one or more client devices; and
         distribute the received one or more uplink communications signals from the one or more client devices to the one or more uplink communications links; and
   a power distribution system comprising:
      one or more power distribution circuits each comprising:
         a distribution power input configured to receive current distributed by a power source;
         a distribution power output configured to distribute the received current over a power conductor coupled to an assigned remote unit among the plurality of remote units;
         a distribution switch circuit coupled between the distribution power input and the distribution power output, the distribution switch circuit comprising a distribution switch control input configured to receive a distribution power connection control signal indicating a distribution power connection mode;
            the distribution switch circuit configured to be closed to couple the distribution power input to the distribution power output in response to the distribution power connection mode indicating a distribution power connect state; and
            the distribution switch circuit further configured to be opened to decouple the distribution power input from the distribution power output in response to the distribution power connection mode indicating a distribution power disconnect state; and a current measurement circuit among one or more current measurement circuits coupled to the distribution power output and comprising a current measurement output among one or more current measurement outputs;

the current measurement circuit configured to measure a current at the distribution power output and generate a current measurement on the current measurement output based on the measured current at the distribution power output; and a controller circuit comprising:

one or more current measurement inputs communicatively coupled to the one or more current measurement outputs of the one or more current measurement circuits of the one or more power distribution circuits;

the controller circuit configured to, for a power distribution circuit among the one or more power distribution circuits:

generate the distribution power connection control signal indicating the distribution power connection mode to the distribution switch control input of the power distribution circuit indicating the distribution power connect state;

determine if the measured current on a current measurement input among the one or more current measurement inputs of the power distribution circuit exceeds a predefined threshold current level; and in response to the measured current of the power distribution circuit exceeding the predefined threshold current level, communicate the distribution power connection control signal comprising the distribution power connection mode to the distribution switch control input of the power distribution circuit indicating the distribution power disconnect state.

2. The DCS of claim 1, wherein each remote unit among the plurality of remote units further comprises a remote management communications input coupled to a management communications link.

3. The DCS of claim 2, wherein the remote switch control circuit comprises a remote switch control input configured to receive a remote power connection signal over the remote management communications input indicating the remote power connection mode and configured to generate the remote power connection signal indicating the remote power connection mode.

4. The DCS of claim 3, wherein the power distribution system further comprises a distribution management communications output coupled to the management communications link coupled to the assigned remote unit.

5. The DCS of claim 4, wherein the controller circuit is further configured, for the power distribution circuit among the one or more power distribution circuits, to communicate the remote power connection signal comprising the remote power connection mode indicating the remote power disconnect state over the distribution management communications output coupled to the assigned remote unit to the power distribution circuit to cause the assigned remote unit to decouple current from the power conductor of the power distribution circuit.

6. The DCS of claim 2, wherein:

the one or more downlink communications links comprise one or more optical downlink communications links; and the one or more uplink communications links comprise one or more optical uplink communications links.

7. The DCS of claim 2, wherein each remote unit among the plurality of remote units further comprises:

one or more optical-to-electrical (O-E) converters configured to convert the received one or more downlink communications signals comprising one or more optical downlink communications signals into one or more electrical downlink communications signals; and one or more electrical-to-optical (E-O) converters configured to convert the received one or more uplink communications signals comprising one or more electrical uplink communications signals into one or more optical uplink communications signals.

8. The DCS of claim 1, wherein the controller circuit is further configured to lower a voltage level on the distribution power output from a first voltage level to a second voltage level distributing the received current over the power conductor coupled to the assigned remote unit.

9. The DCS of claim 8, wherein the controller circuit is further configured to raise the voltage level on the distribution power output from the second voltage level to the first voltage level distributing the received current over the power conductor coupled to the assigned remote unit.

10. The DCS of claim 9, wherein the controller circuit is further configured to determine if the measured current on the current measurement input among the one or more current measurement inputs of the power distribution circuit exceeds the predefined threshold current level when the distribution switch circuit is closed to couple the distribution power input to the distribution power output in response to the raising of the voltage level on the distribution power output.

11. The DCS of claim 8, wherein:

the one or more downlink communications links comprise one or more optical downlink communications links; and the one or more uplink communications links comprise one or more optical uplink communications links.

12. The DCS of claim 8, wherein each remote unit among the plurality of remote units further comprises:

one or more optical-to-electrical (O-E) converters configured to convert the received one or more downlink communications signals comprising one or more optical downlink communications signals into one or more electrical downlink communications signals; and one or more electrical-to-optical (E-O) converters configured to convert the received one or more uplink communications signals comprising one or more electrical uplink communications signals into one or more optical uplink communications signals.

13. The DCS of claim 1, further comprising one or more extended remote units, each extended remote unit comprising:

an extended remote communications input coupled to an extended downlink communications link coupled to a remote unit among the plurality of remote units;

a remote communications output coupled to an extended uplink communications link coupled to the remote unit; and an extended remote power input coupled to an extended power conductor carrying current from the remote unit to the extended remote unit.

14. The DCS of claim 13, wherein the central unit is configured to distribute each of the received one or more downlink communications signals over a distribution communications output among a plurality of distribution communications outputs to a downlink communications link among the one or more downlink communications links.

15. The DCS of claim 14, wherein the central unit is further configured to distribute each of the received one or more uplink communications signals from an uplink communications link among the one or more uplink communications links on a distribution communications input among the plurality of distribution communications inputs, to the one or more source communications outputs.

16. The DCS of claim 13, wherein:
the one or more downlink communications links comprise one or more optical downlink communications links; and
the one or more uplink communications links comprise one or more optical uplink communications links.

17. The DCS of claim 13, wherein each remote unit among the plurality of remote units further comprises:
one or more optical-to-electrical (O-E) converters configured to convert the received one or more downlink communications signals comprising one or more optical downlink communications signals into one or more electrical downlink communications signals; and
one or more electrical-to-optical (E-O) converters configured to convert the received one or more uplink communications signals comprising one or more electrical uplink communications signals into one or more optical uplink communications signals.

18. The DCS of claim 1, wherein the central unit is configured to distribute each of the received one or more downlink communications signals over a distribution communications output among a plurality of distribution communications outputs to a downlink communications link among the one or more downlink communications links.

19. The DCS of claim 18, wherein the central unit is further configured to distribute each of the received one or more uplink communications signals from an uplink communications link among the one or more uplink communications links on a distribution communications input among a plurality of distribution communications inputs, to the one or more source communications outputs.

20. The DCS of claim 19, wherein:
the one or more downlink communications links comprise one or more optical downlink communications links; and
the one or more uplink communications links comprise one or more optical uplink communications links.

21. The DCS of claim 18, wherein each remote unit among the plurality of remote units further comprises:
one or more optical-to-electrical (O-E) converters configured to convert the received one or more downlink communications signals comprising one or more optical downlink communications signals into one or more electrical downlink communications signals; and
one or more electrical-to-optical (E-O) converters configured to convert the received one or more uplink communications signals comprising one or more electrical uplink communications signals into one or more optical uplink communications signals.

22. The DCS of claim 1, wherein:
the one or more downlink communications links comprise one or more optical downlink communications links; and
the one or more uplink communications links comprise one or more optical uplink communications links.

23. The DCS of claim 1, wherein the central unit further comprises:
one or more electrical-to-optical (E-O) converters configured to convert the received one or more downlink communications signals comprising one or more electrical downlink communications signals into one or more optical downlink communications signals; and
one or more optical-to-electrical (O-E) converters configured to convert the received one or more uplink communications signals comprising one or more optical uplink communications signals into one or more electrical uplink communications signals.

24. The DCS of claim 23, wherein the central unit is further configured to:
distribute the one or more optical downlink communications signals from the one or more E-O converters over a plurality of optical distribution communication outputs to the one or more optical downlink communications links; and
distribute the received one or more optical uplink communications signals from the one or more optical uplink communications links on a plurality of optical distribution communications inputs, to the one or more O-E converters.

25. The DCS of claim 24, wherein each remote unit among the plurality of remote units further comprises:
one or more optical-to-electrical (O-E) converters configured to convert the received one or more optical downlink communications signals into one or more electrical downlink communications signals; and
one or more electrical-to-optical (E-O) converters configured to convert received one or more electrical uplink communications signals into the one or more optical uplink communications signals.

26. The DCS of claim 25, wherein each remote unit among the plurality of remote units configured to:
distribute the one or more electrical downlink communications signals from the one or more O-E converters, to one or more client devices; and
distribute the one or more optical uplink communications signals from the one or more E-O converters to the one or more optical downlink communications links.

* * * * *